United States Patent [19]
Sato et al.

[11] Patent Number: 5,760,583
[45] Date of Patent: Jun. 2, 1998

[54] RF COIL FOR MRI AND MRI APPARATUS

[75] Inventors: Kenji Sato; Osamu Furuta; Naoki Nakamura; Takashi Ishiguro, all of Tokyo, Japan

[73] Assignee: GE Yokogawa Medical Systems, Limited, Tokyo, Japan

[21] Appl. No.: 653,643

[22] Filed: May 24, 1996

[51] Int. Cl.$^6$ ..................................................... G01V 3/00
[52] U.S. Cl. ........................................... 324/318; 324/322
[58] Field of Search ....................................... 324/318, 322, 324/314, 300, 309; 128/653.5

[56] References Cited

U.S. PATENT DOCUMENTS

| | | | |
|---|---|---|---|
| 4,857,849 | 8/1989 | Sakamoto | 324/318 |
| 4,899,108 | 2/1990 | Fujita et al. | 324/318 |
| 5,517,120 | 5/1996 | Misic et al. | 324/318 |
| 5,539,314 | 7/1996 | Arakawa et al. | 324/318 |

*Primary Examiner*—Louis M. Arana
*Attorney, Agent, or Firm*—Moonray Kojima

[57] ABSTRACT

A RF coil for MRI is presented which is capable of optimizing current distributions and expanding a magnetic field uniform region using a saddle coil having wide elements also presented is an MRI apparatus using the RF coil. A RF coil for MRI, which includes main paths 1a and 1b provided in parallel to each other and connecting paths 1e, 1f, 1g and 1h for connecting the main paths to each other and is constructed in a saddle form, is configured so as to have slits 2e, 2f, 2g and 2h defined therein in the vicinity of regions where the connecting paths are respectively connected to the main paths.

9 Claims, 20 Drawing Sheets

RF COIL FOR MRI AND MRI APPARATUS

BACKGROUND OF THE INVENTION

The present invention relates to a RF coil suitable for use in magnetic resonance imaging (MRI) and an MRI apparatus using the RF coil, and particularly to improvements in magnetic field uniform region, openability and frequency adjustment of a saddle coil type MRI RF coil and an MRI apparatus using this type of RF coil.

An MRI apparatus measures a density distribution, a relaxing time distribution, etc. of nuclear spins at a desired inspecting portion of a body or specimen to be examined, using a nuclear magnetic resonance phenomenon and displays a section of the body to be examined from the measured data as an image.

The nuclear spins of the body to be examined placed within a device for generating an uniform and powerful magnetostatic field, perform precession motion at a frequency (Larmor frequency) which is dependent on the strength of the magnetostatic field with the direction of the magnetostatic field as the axis. Thus, when a high-frequency pulse of a frequency equal to the Larmor frequency is externally applied, the spins are excited so as to be transitioned into a high energy state. This is referred to herein as "nuclear magnetic resonance phenomenon". When the application of the high-frequency pulse is terminated, the spins are returned to the original low energy states at the time constants dependent on their states. At this time, an electromagnetic wave is applied to the outside. The applied electromagnetic wave is detected by a high-frequency receiving coil (RF coil) tuned to the frequency thereof. At this time, triaxial gradient magnetic fields are applied to a magnetostatic filed space with a view toward adding positional information into the space. As a result, the positional information in the space can be recognized as frequency information.

In this type of MRI apparatus, a RF coil for applying a high-frequency rotational magnetic field to the body to be examined or receiving therein an electromagnetic wave produced in the body holds the body therein and allows a high-frequency current to flow into a coil (element) portion about the body.

As a kind of the structure of the RF coil, may be mentioned one shaped in a saddle configuration (saddle-type one). One example of a RF coil (hereinafter be called merely "saddle coil") 1 having such a saddle structure is shown in FIG. 24. The saddle coil 1 is configured in combination of two sets of saddles in such a manner that portions regarded as mountains of the saddles extend outward each other to be shaped in the form of a cylinder as a whole.

In the saddle coil 1, a body to be examined is to be placed within a space surrounded by the saddle coil 1. Here, adjacent main paths 1a and 1b extending in a Z direction are configured so as to take the same current direction as shown in FIG. 24.

Similarly, adjacent main paths 1c and 1d are respectively configured so as to assume the current direction opposite to that taken by the aforementioned main paths 1a and 1b. Further, connecting paths 1e, 1f, 1g and 1h for connecting these main paths to one another are respectively shaped in the form of circular arcs or inverted U-shaped frames.

A magnetic field B1 is produced in an X direction owing to currents that flow through the main paths 1a, 1b, 1c and 1d.

In this type of saddle coil, a method of increasing element widths is in existence or considered to reduce high-frequency power required to perform desired excitation. As a reason why the high-frequency power may be low owing to the extension of each-element width, may be mentioned the fact that the influence of magnetic fields from eddy currents produced in a shielding member about the saddle coil can be suppressed owing to shielding effects of wide elements themselves.

However, another problem arises due to the use of the wide elements. Namely, since the current will flow within each wide element along the shortest distance, current distributions occur with emphasis in the vicinity of the insides of the respective elements in the case of the saddle configuration shown in FIG. 24.

FIG. 25 is a view showing the structure of the saddle coil 1 as seen from a Y direction. FIG. 25 illustrates a current distribution formed in a main path 1a and connecting paths 1e and 1g and a current distribution formed in a main path 1b and connecting paths 1f and 1h.

Owing to the aforementioned reason, the current distribution reaches a maximum inside the main paths 1a and 1b. In this drawing, the neighborhood at which each current distribution reaches the maximum, is indicated by arrow. However, the current flows even in portions other than the neighborhood thereof and the value of the current becomes small outside current paths or channels of the main paths (at positions thereof opposed to each other).

FIG. 26 is a characteristic diagram showing the strength of a magnetic field $B_1$ produced owing to the main paths 1a, 1b, 1c and 1b. The magnetic field strength is measured at each point extending in the Z-axis direction at a position spaced equidistantly from the main paths 1a through 1d.

As shown in FIG. 27, a comparison was made between a saddle coil (see FIG. 27(a)) in which main paths 1a and 1b and connecting paths 1e, 1f, 1g and 1h are made up of wide elements (whose each width is $W_2$) and a saddle coil (see FIG. 27(b)) in which main paths 1a and 1b and connecting paths 1e, 1f, 1g and 1h are composed of normal thin or narrow elements (whose each width is $W_1$) on condition that main path lengths $Z_0$ are equal to each other.

The obtained results of magnetic field strength are shown by normalized relative values so that their maximum peaks become 0dB.

For example, when a range in which the strength of the magnetic field falls between 0dB and −3dB, is defined as a magnetic field uniform region, the magnetic field uniform region, which has remained at $Z_1$ in the case of the normal narrow elements, becomes a narrow range as is represented in $Z_2$ ($<Z_1$) by using the wide elements.

This is because the saddle coil producing the magnetic field $B_1$ acts as if it was substantially reduced in size owing to the displacement of each current distribution toward the inside as shown in FIG. 25.

Thus, a problem arose that the uniform region obtained by the saddle coil 1 would be so narrowed as compared with the size of an actual saddle coil 1. A further problem also arose that shading would occur in an image due to the narrowness of the uniform region.

An apparatus equipped with a magnet assembly 20 shown in FIG. 28 has been proposed to improve the openability about a body to be examined in an MRI apparatus.

The MRI apparatus shown in FIG. 28 comprises base yokes 22a and 22b provided so as to be vertically opposed to one another, columnar yokes 23a and 23b for supporting the base yokes 22a and 22b at their peripheral edges, permanent magnets 28a (not shown) and 28b provided on the opposed surfaces of the vertically opposed base yokes so as to be opposed to each other, and magnetic shunt or adjusting plates 29a (not shown) and 29b for adjusting magnetic fields of the permanent magnets.

Thus, the structure for supporting the base yokes by the two posts corresponding to the columnar yokes 23a and 23b at the peripheral edges of the base yokes 22a and 22b can enhance the openability as compared with a magnet assembly of a conventional MRI apparatus with four posts.

However, even in the case of the use of such a magnet assembly providing the high openability, a problem arises that the magnet assembly with the two posts is impaired in openability owing to the provision of the saddle coil 1, which has been already shown in FIG. 24.

In a RF coil for MRI, capacitors (tuning capacitors) for providing tuning to a frequency to be used are provided within elements.

In this type of RF coil for MRI, there may be cases in which the interval between the surrounding (RF shield or the like) and the RF coil for MRI becomes a value different from that to be expected, depending on the situation of the installation of the RF coil for MRI. Therefore, the tuning frequency is often shifted from the expected value.

In this case, the frequency shift is corrected and processed by finely adjusting the capacitance of each tuning capacitor employed in the MRI RF coil by means of a variable capacitance capacitor such as a trimmer capacitor.

However, when the aforementioned frequency shift greatly varies, there is also a possibility that it exceeds a frequency range capable of being finely adjusted by the variable capacitance capacitor such as the trimmer capacitor or the like.

Further, the frequency deviation or shift based on the difference in interval between the MRI RF coil and the RF shield is revealed after the installation of the MRI apparatus. It is not possible to perform work such as the attachment (or detachment) of externally-provided capacitors after it has been revealed that the frequency shift cannot be adjusted by the trimmer capacitor. Thus, an increase in frequency shift will create a difficulty in its adjustment.

SUMMARY OF THE INVENTION

With the foregoing in view, it is an object (hereinafter be called "first object") of the present invention to provide a RF coil for MRI, which is capable of optimizing current distributions and expanding a magnetic field uniform region using a saddle coil.

It is another object (hereinafter be called "second object") of the present invention to provide a RF coil for MRI, which provides excellent openability using a saddle coil capable of optimizing current distribution of elements and expanding a magnetic field uniform region.

It is a further object (hereinafter be called "third object") of the present invention to provide a RF coil for MRI, which is easy to adjust a large or wide frequency range.

It is a still further object (hereinafter be called "fourth object") of the present invention to provide an MRI apparatus which is excellent in openability and easy to adjust a large or wide frequency range under the use of the RF coil for MRI for achieving the above objects.

The inventors of the present application have carried out an extensive investigation to improve problems about the magnetic field uniform region of the conventional RF coil for MRI. As a result, the present inventors have found a new method of adjusting positions of current distributions of an MRI RF coil using wide elements so as to optimize a magnetic field uniform region, thereby leading to completion of the inventions for achieving the first object.

<Inventions for Achieving First Object>

The inventions for achieving the first object will be described in accordance with the following paragraphs (1) through (3):

(1) A first invention for achieving the first object provides a RF coil for MRI, which includes main paths parallel to each other and connecting paths for connecting the main paths to one another and wherein elements are constructed in a saddle configuration, the RF coil having slits in the vicinity of regions where the connecting paths are respectively coupled to the main paths.

According to the RF coil for MRI, since the slits are provided in the neighborhood of the regions where the connecting paths are respectively connected to the main paths, current distributions at the main paths expand around the slits. Accordingly, the positions of the current distributions are adjusted so that a magnetic field uniform region expands.

(2) A second invention for achieving the first object provides a RF coil for MRI, which has a plurality of main paths and connecting paths for connecting these main paths to one another and wherein elements are configured in a saddle form and the interval between the adjacent main paths varies at ends and central portions thereof.

According to the RF coil for MRI, since the interval between the adjacent main paths varies at the ends and the central portions thereof, current distributions at the main paths are narrowed in interval at the ends of the main paths. Accordingly, a magnetic field is strengthened at the ends of the main paths, so that a magnetic field uniform region expands.

(3) A third invention for achieving the first object provides a RF coil for MRI, which includes main paths parallel to each other and connecting paths for connecting these main paths to one another and wherein elements are configured in a saddle form and the length of each main path extends so as to become greater than the interval between the connecting paths.

According to the RF coil for MRI, since the length of each main path extends so as to be longer than the interval between the connecting paths, current distributions at the main paths are extended in the direction of the main paths. Accordingly, a magnetic field is extended at ends of the main paths, whereby a magnetic field uniform region expands.

As the inventions for achieving the first object referred to above, the inventions to be described in the following paragraphs (4) through (10), which are other than the inventions described in the paragraphs (1) through (3), are also included.

(4) A fourth invention for achieving the first object provides a RF coil for MRI, which has main paths parallel to each other and connecting paths for connecting these main paths to one another and wherein elements are formed in a saddle configuration, the RF coil having slits parallel to the main paths, which are defined in the vicinity of regions where the connecting paths are respectively coupled to the main paths.

According to the RF coil for MRI, since the slits parallel to the main paths are provided in the neighborhood of the regions where the connecting paths are respectively connected to the main paths, current distributions at the main paths expand in the direction of the main paths. Accordingly, the positions of the current distributions are adjusted so that a magnetic field uniform region expands.

(5) A fifth invention for achieving the first object provides a RF coil for MRI, which includes main paths parallel to each other and connecting paths for connecting these main paths to one another and wherein elements are constructed in a saddle configuration, the RF coil having slits extending in the direction perpendicular to the main paths, which are respectively defined in the main paths.

In this type of RF coil for MRI, the slits extending vertically to the main paths are respectively defined in the main paths. Therefore, current distributions at the main paths are narrowed in interval at ends of the main paths. Accordingly, a magnetic field is made strong at the ends of the main paths, whereby a magnetic field uniform region expands.

(6) A sixth invention for achieving the first object provides a RF coil for MRI, which includes main paths parallel to each other and connecting paths for connecting these main paths to one another and wherein elements are provided in a saddle configuration, the RF coil having slits which are provided in the vicinity of regions where the connecting paths are respectively connected to the main paths and which are defined by a combination of slits extending in parallel with the main paths and slits extending in the direction perpendicular to the main paths.

In the RF coil for MRI, the slits defined by the combination of the slits extending in parallel with the main paths and the slits extending in the direction perpendicular to the main paths are provided in the vicinity of the regions where the connecting paths are respectively connected to the main paths. Therefore, current distributions at the main paths expand in the direction of the main paths and are narrowed in space at ends of the main paths. Thus, a magnetic filed is extended and strengthened at the ends of the main paths and hence a magnetic field uniform region expands.

(7) A seventh invention for achieving the first object provides a RF coil for MRI, which includes main paths parallel to each other and connecting paths for connecting these main paths to one another and wherein elements are constructed in a saddle form, the RF coil having slits parallel to the main paths and slits extending in the direction orthogonal to the main paths.

In this type of RF coil for MRI, the slits parallel to the main paths and the slits extending in the direction perpendicular to the main paths are provided in the vicinity of regions where the connecting paths are respectively connected to the main paths. Therefore, current distributions at the main paths expand in the direction of the main paths and are narrowed in space or interval at ends of the main paths. Accordingly, a magnetic field is extended and strengthened at the ends of the main paths, whereby a magnetic field uniform region expands.

(8) An eighth invention for achieving the first object provides a RF coil for MRI, which includes man paths parallel to each other and connecting paths for connecting these main paths to one another and wherein elements are constructed in a saddle configuration, the RF coil having slits provided in the vicinity of regions where the connecting paths and the main paths are respectively connected to one another and extending in the direction of respectively dividing angles formed by the main paths and the connecting paths into substantially equal parts.

According to the RF coil for MRI, since the slits extending in the direction of respectively dividing the angles formed by the main paths and the connecting paths into the substantially equal parts are respectively provided in the vicinity of the regions where the connecting paths are respectively connected to the main paths, current distributions at the main paths expand in the direction of the main paths and are narrowed in space at ends of the main paths. Accordingly, a magnetic field is extended and strengthened at the ends of the main paths and hence a magnetic field uniform region expands.

(9) A ninth invention for achieving the first object provides a RF coil for MRI, which includes a plurality of main paths and connecting paths for connecting these main paths to one another and wherein elements are constructed in a saddle configuration and the interval between the adjacent main paths varies at ends and central portions thereof, the RF coil having slits provided in the vicinity of regions where the connecting paths and the main paths are respectively connected to one another.

According to this type of RF coil for MRI, since the interval between the adjacent main paths is defined so as to vary at the ends and central portions thereof and the slits are respectively provided in the neighborhood of the regions where the connecting paths and the main paths are respectively connected to each other, current distributions at the main paths expand around the slits and are narrowed in space at the ends of the main paths. Accordingly, a magnetic field is extended and strengthened at the ends of the main paths and hence a magnetic field uniform region expands.

(10) A tenth invention for achieving the first object provides a RF coil for MRI, including main paths parallel to each other and connecting paths for connecting these main paths to one another, wherein elements are constructed in a saddle configuration and the lengths of the main paths extend so as to become greater than an interval between the connecting paths, the RF coil having slits respectively provided in the vicinity of regions where the connecting paths and the main paths are respectively connected to one another.

In the RF coil for MRI, the length of each main path extends so as to become greater than the interval between the connecting paths and the slits are provided in the neighborhood of the regions where the connecting paths and the main paths are respectively connected to one another. Therefore, current distributions at the main paths extend in the direction of the main paths and the interval between the main paths is narrowed at ends of the main paths. Accordingly, a magnetic field is extended and strengthened at the ends of the main paths and hence a magnetic field uniform region is broadened.

<Inventions for Achieving Second Object>

Further, the inventors of the present application have carried out an extensive investigation to improve problems about the openability of the conventional saddle coil. As a result, the inventors have brought the inventions for achieving the second object, which optimize the shapes of connecting paths for the saddle coil and avoid the sacrifice of uniformity of a magnetic field, to completion on the basis of these findings.

Namely, the inventions for achieving the second object will be described below in accordance with the following paragraphs (11) through (14).

(11) An eleventh invention for achieving the second object provides a RF coil for MRI, wherein elements composed of main paths parallel to each other and connecting paths for connecting these main paths to one another are configured in a saddle form, the RF coil being constructed such that the connecting paths include equally-spaced connecting paths along which the opposed elements extend in parallel to each other, and unequally-spaced connecting paths for respectively connecting ends of the main paths to the equally-spaced connecting paths, the interval between the equally-spaced connecting paths becomes narrower than the length of each main path and the equally-spaced connecting paths are provided along two columnar yokes of a magnet assembly wherein base yokes provided with magnets disposed so as to be vertically opposed to each other are supported by the two columnar yokes at peripheral edges thereof.

In the RF coil for MRI, the length of each main path extends so as to become greater than the interval between the connecting paths. Thus, current distributions at the main paths expand in the direction of the main paths. Accordingly, a magnetic field is made broad at the ends of the main paths and hence a magnetic field uniform region expands.

Further, since the equally-spaced connecting paths are provided along the columnar yokes of the magnet assembly supported by the two columnar yokes, the present coil is superior in openability to the conventional saddle coil and the openability of the magnet assembly with the two posts is not impaired.

(12) A twelfth invention for achieving the second object provides a RF coil for MRI, characterized in that in the invention described in the aforementioned paragraph (11), main paths and unequally-spaced connecting paths are provided along vertically opposed magnets and the equally-spaced connecting paths are provided along two columnar yokes for supporting base yokes provided with the magnets at their peripheral edges.

In the RF coil for MRI, the length of each main path extends so as to become greater than the interval between the connecting paths. Thus, current distributions at the main paths expand in the direction of the main paths. Accordingly, a magnetic field is extended at the ends of the main paths and hence a magnetic field uniform region expands.

In a magnet assembly supported by the two columnar yokes, the main paths and the unequally-spaced connecting paths are provided along the vertically opposed magnets and the equally-spaced connecting paths are provided along the columnar yokes. Therefore, the present coil is superior in openability to the conventional saddle coil and the openability of the magnet assembly with the two posts is not impaired.

(13) A thirteenth invention for achieving the second object provides a RF coil for MRI, characterized in that in the invention described in the paragraph (11), ends of main paths, unequally-spaced connecting paths and equally-spaced connecting paths are provided along vertically opposed magnets and central portions of the equally-spaced connecting paths are provided along two columnar yokes for supporting base yokes provided with the magnets at their peripheral edges.

In the RF coil for MRI, the length of each main path extends so as to become greater than the interval between the connecting paths, so that current distributions at the main paths expand in the main path direction. Accordingly, a magnetic field is extended at the ends of the main paths and hence a magnetic field uniform region expands.

In a magnet assembly supported by the two columnar yokes, the ends of the main paths, unequally-spaced connecting paths and equally-spaced connecting paths are provided along the vertically opposed magnets and the central portions of the equally-spaced connecting paths are provided along the columnar yokes. Therefore, the present coil is superior in openability to the conventional saddle coil and the openability of the magnet assembly having the two posts configured so as to extend in the transverse direction thereof is not impaired.

(14) Incidentally, the interval between the adjacent main paths of each of the MRI RF coils according to the inventions described in the paragraphs (11) through (13) may be set so as to vary at the ends and central portions thereof. The magnetic field uniform region can be further broadened.

Further, slits may be provided in the neighborhood of regions where the connecting paths and the main paths of each of the MRI RF coils according to the inventions described in the paragraphs (11) through (13) are connected to one another. The magnetic field uniform region can be further expanded.

<Inventions for achieving third object>

The inventors of the present application have carried out an extensive investigation to improve problems about adjustments to the frequency employed in the conventional MRI RF coil. As a result, the present inventors have found a new method of varying the capacitance of each of tuning capacitors, thereby leading to completion of the inventions able to achieve the third object.

Namely, the inventions for achieving the third object will be described below in accordance with the following paragraphs (15) through (16).

(15) A fifteenth invention for achieving the third object provides an MRI RF coil having tuning capacitors respectively attached to elements, which comprises tuning capacitors electrically connected between the elements, wiring patterns cuttable from the elements, and tuning capacitors electrically connected between the wiring patterns so as to become parallel with the tuning capacitors between the elements.

In this type of RF coil for MRI, the tuning capacitors for the wiring patterns cuttable from the elements are also connected in addition to the tuning capacitors connected between the elements in advance.

Thus, a RF coil for MRI can be materialized which is capable of adjusting the capacitances of the tuning capacitors by electrically cutting the cuttable wiring patterns from the elements and is easy to adjust a large or wide frequency range.

(16) A sixteenth invention for achieving the third object provides an MRI RF coil having tuning capacitors respectively attached to elements, which includes tuning capacitors electrically connected between the elements and tuning capacitors disposed so as to be in parallel with the tuning capacitors between the elements via switch means electrically openable and closable relative to the elements As the switch means, may be used combinations of jumper pins and jumper switches and various switches such as a toggle switch, a dip switch or relay, etc.

In the RF coil for MRI, electrically connectable and cuttable capacitors are also connected through the switch means electrically openable and closable relative to the elements in addition to the tuning capacitors connected between the elements in advance.

Thus, a RF coil for MRI can be realized wherein the substantial capacitance of each tuning capacitor can be adjusted by opening and closing each switch means and a large or wide frequency range can be easily adjusted.

<Inventions for achieving fourth object>

Further, the inventions for achieving the fourth object will be described below in accordance with the following paragraphs (17) through (18).

(17) A seventeenth invention for achieving the fourth object provides an MRI apparatus which comprises a magnet assembly composed of upper and lower base yokes provided with vertically opposed magnets and two columnar yokes for supporting the base yokes at their peripheral edges; and an MRI RF coil in which elements composed of main paths parallel to each other and connecting paths for connecting these main paths to one another are formed in a saddle coil configuration and which is provided inside the magnet assembly, and wherein the connecting paths for the RF coil include equally-spaced connecting paths along which the opposed elements extend in parallel and unequally-spaced connecting paths for providing connections between the ends of the main paths and the equally-spaced connecting paths, the interval between the equally-spaced connecting paths is set so as to become narrower than the length of each main path and is provided along each of the columnar yokes of the magnet assembly.

In the MRI apparatus, the length of each main path constituting each element extends so as to become greater than the interval between the connecting paths. Therefore, current distributions at the main paths expand in the direction of the main paths. Accordingly, a magnetic field is extended at the ends of the main paths whereby a magnetic field uniform region expands.

Since the equally-spaced connecting paths are provided along the columnar yokes of the magnet assembly supported by the two columnar yokes, the present MRI apparatus is superior in openability to the conventional MRI apparatus using the saddle coil, and the openability of the magnet assembly with the two posts or columns is not impaired.

(18) An eighteenth invention for achieving the fourth object provides an MRI apparatus comprising a magnet assembly composed of upper and lower base yokes provided with vertically opposed magnets and two columnar yokes for supporting the base yokes at their peripheral edges; an MRI RF coil in which elements composed of main paths parallel to each other and connecting paths for connecting these main paths to one another are configured in a saddle coil form and which is provided inside the magnet assembly; tuning capacitors placed in any positions of the elements; and tuning capacitors connected between wiring patterns so as to be parallel with the tuning capacitors between the elements via the wiring patterns cuttable from the elements or electrically openable and closable switch means, and wherein the connecting paths for the MRI RF coil include equally-spaced connecting paths along which the opposed elements extend in parallel and unequally-spaced connecting paths for providing connections between ends of the main paths and the equally-spaced connecting paths and the interval between the equally-spaced connecting paths is set so as to become narrower than the length of each main path and is provided along each of the columnar yokes of the magnet assembly.

As the switch means, may be used combinations of jumper pins and jumper switches and various switches such as a toggle switch, a dip switch or relay, etc.

In the MRI apparatus, the tuning capacitors electrically cuttable from the elements are also connected in addition to the tuning capacitors, which have been connected between the elements in advance. Thus, an MRI apparatus can be materialized which is capable of adjusting the substantial capacitances of the tuning capacitors by performing electrical cutting through the cuttable wiring patterns or the switch means and is easy to adjust a large or wide frequency range.

The above and other objects, features and advantages of the present invention will become apparent from the following description and the appended claims, taken in conjunction with the accompanying drawings in which preferred embodiments of the present invention are shown by way of illustrative example.

BRIEF DESCRIPTION OF THE DRAWINGS

The present invention will be described with reference to the accompanying drawings in which.

11

Figure 18:
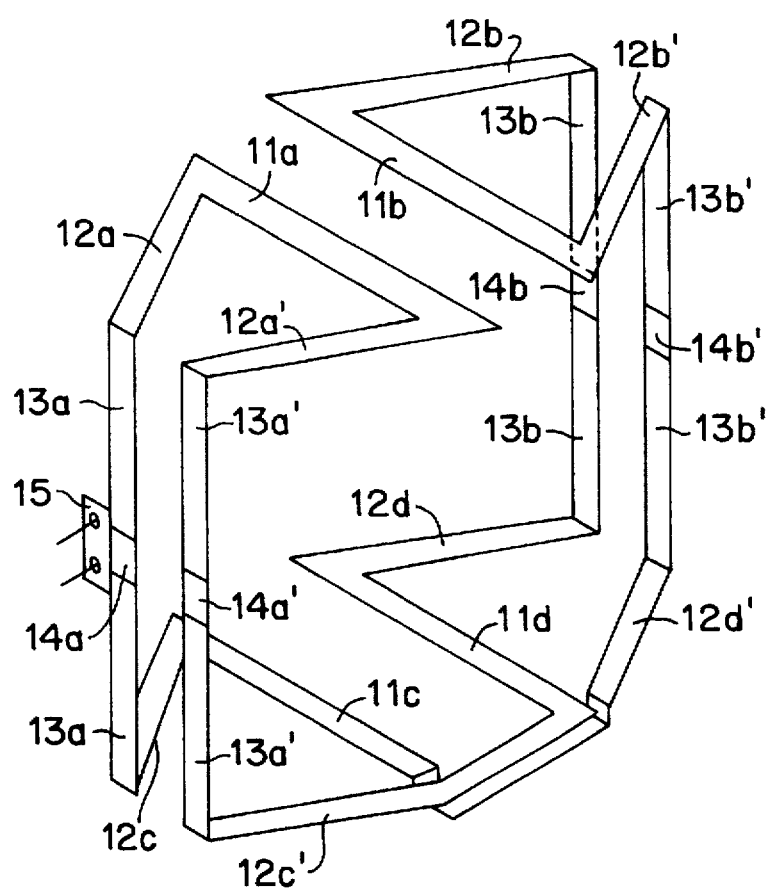
Figure 19:
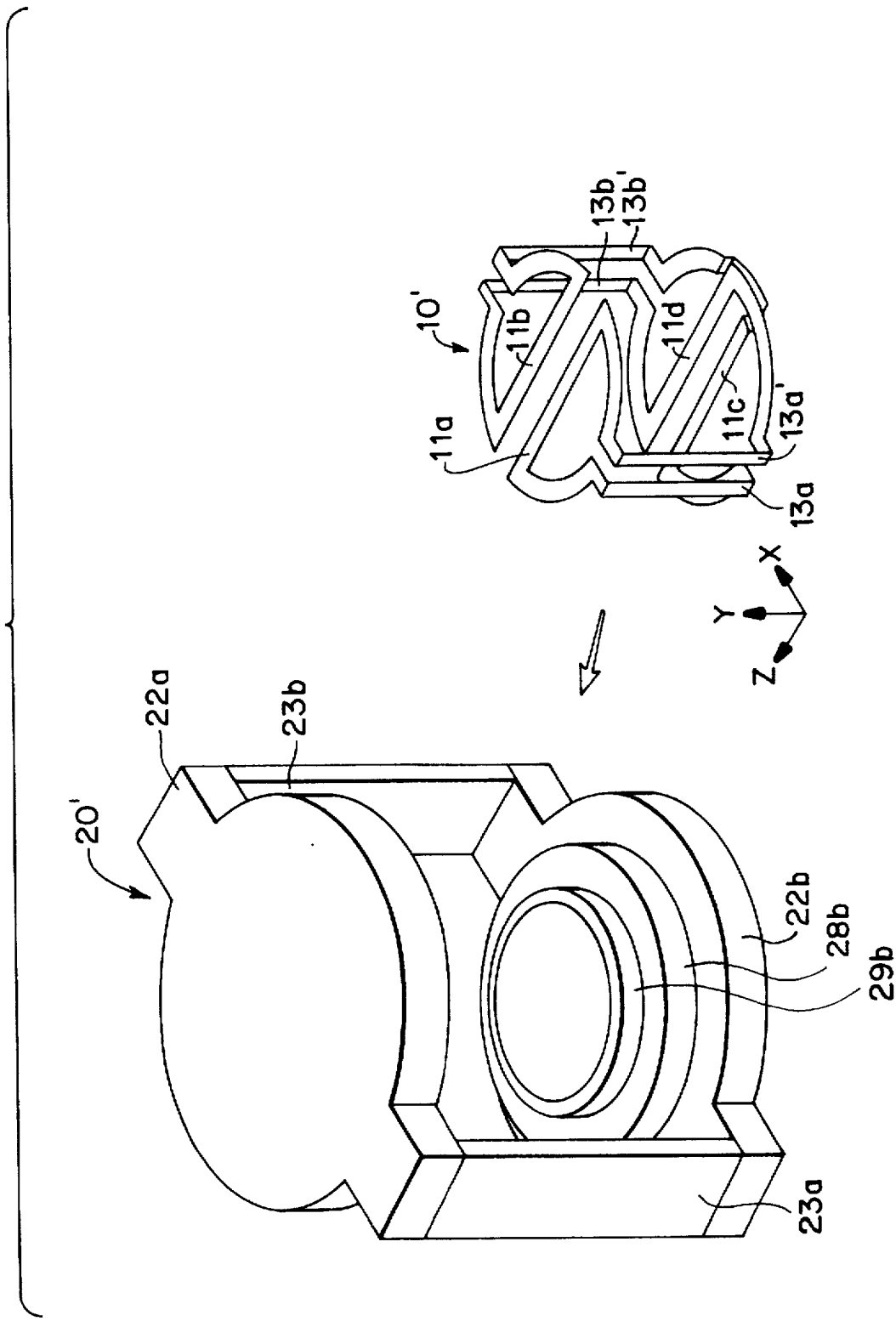
Figure 20:
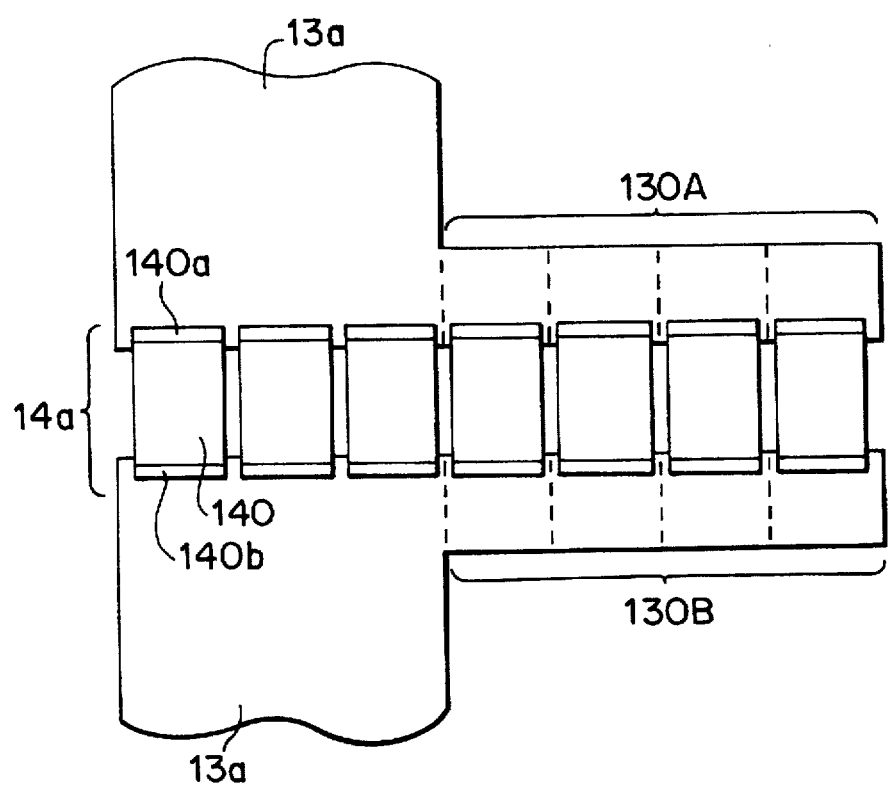
Figure 21:
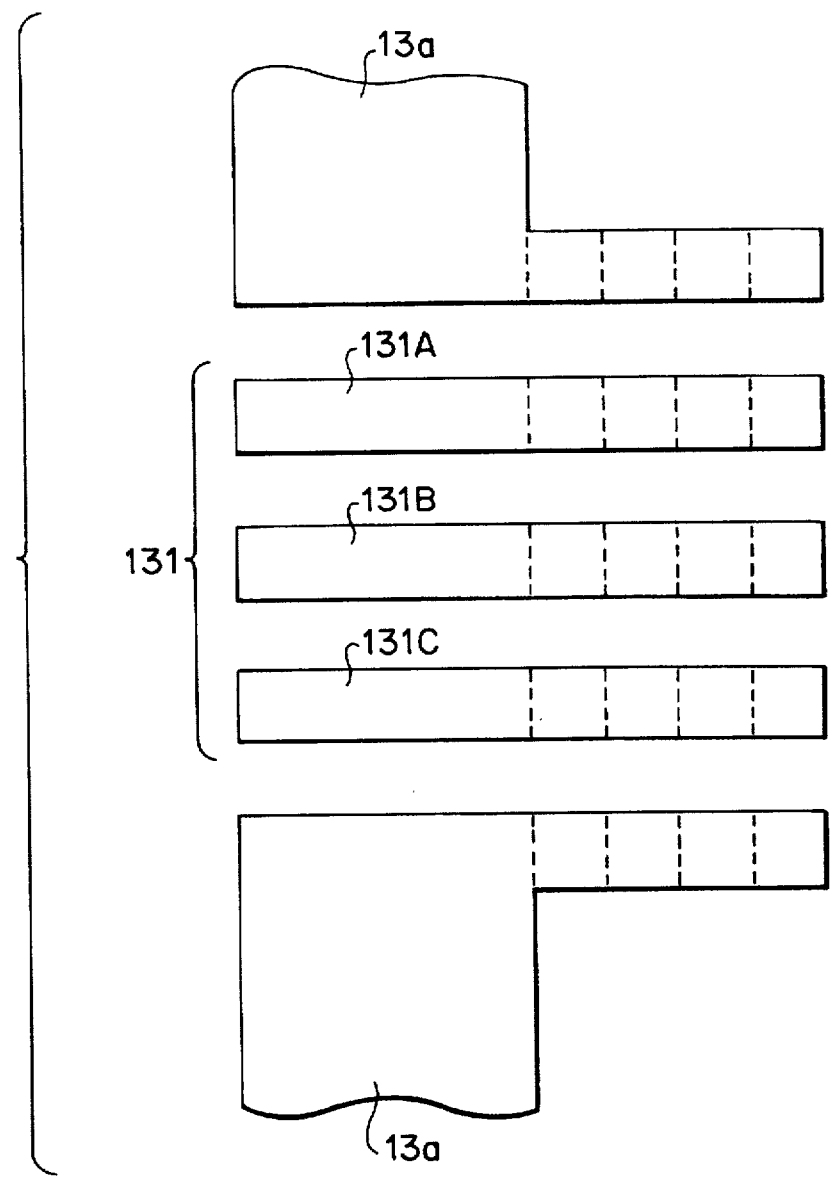
Figure 22:
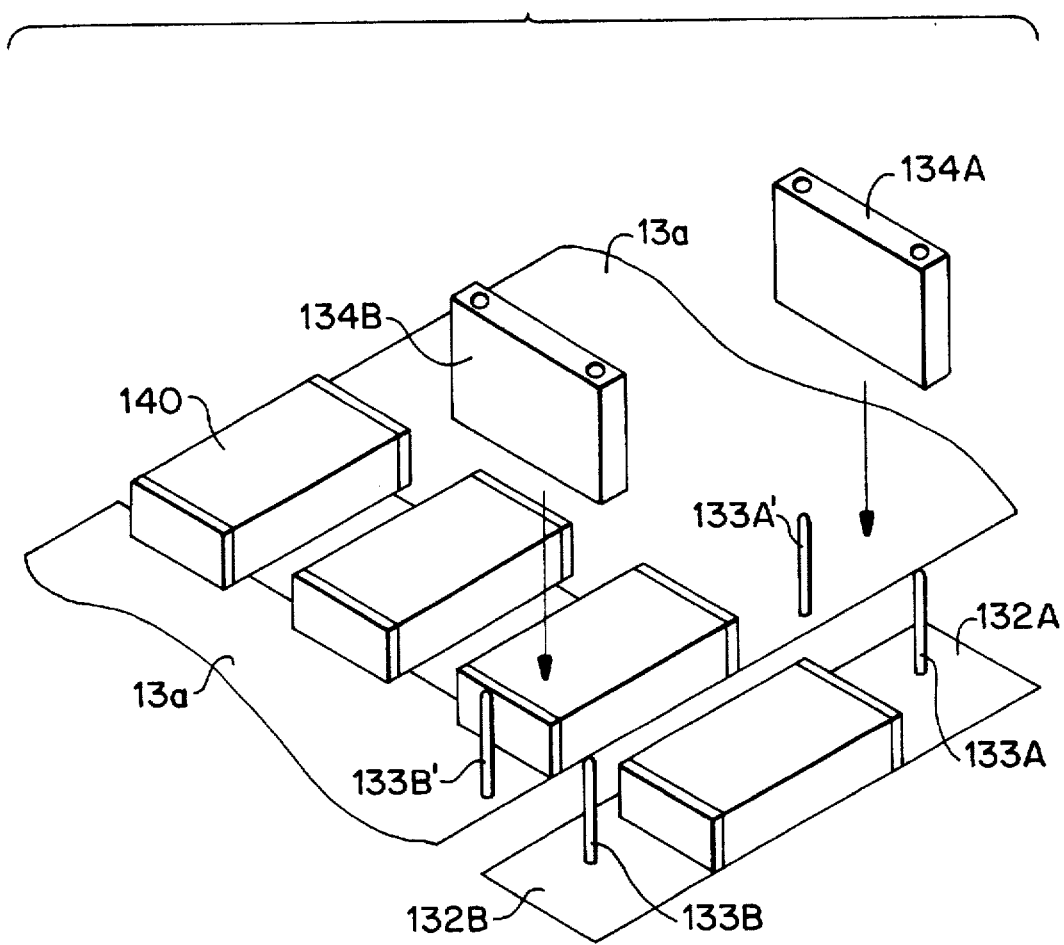
Figure 23:
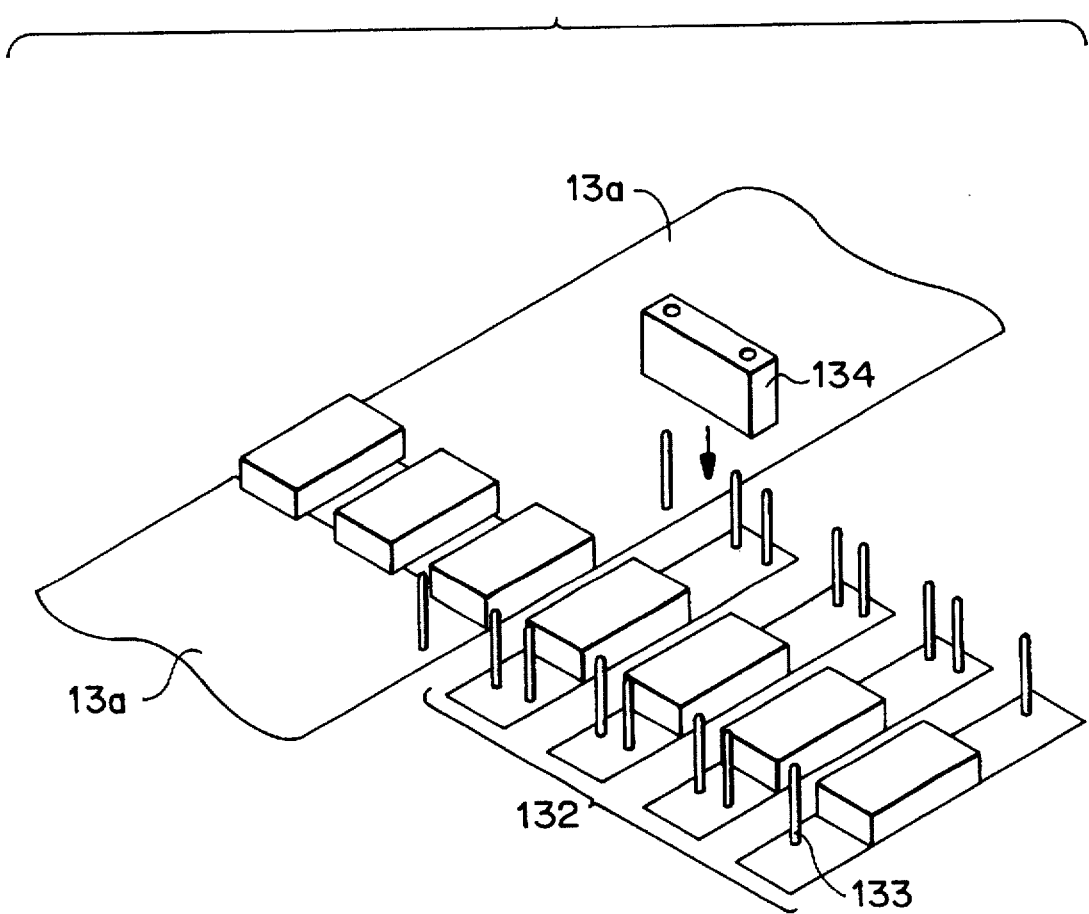
Figure 24:
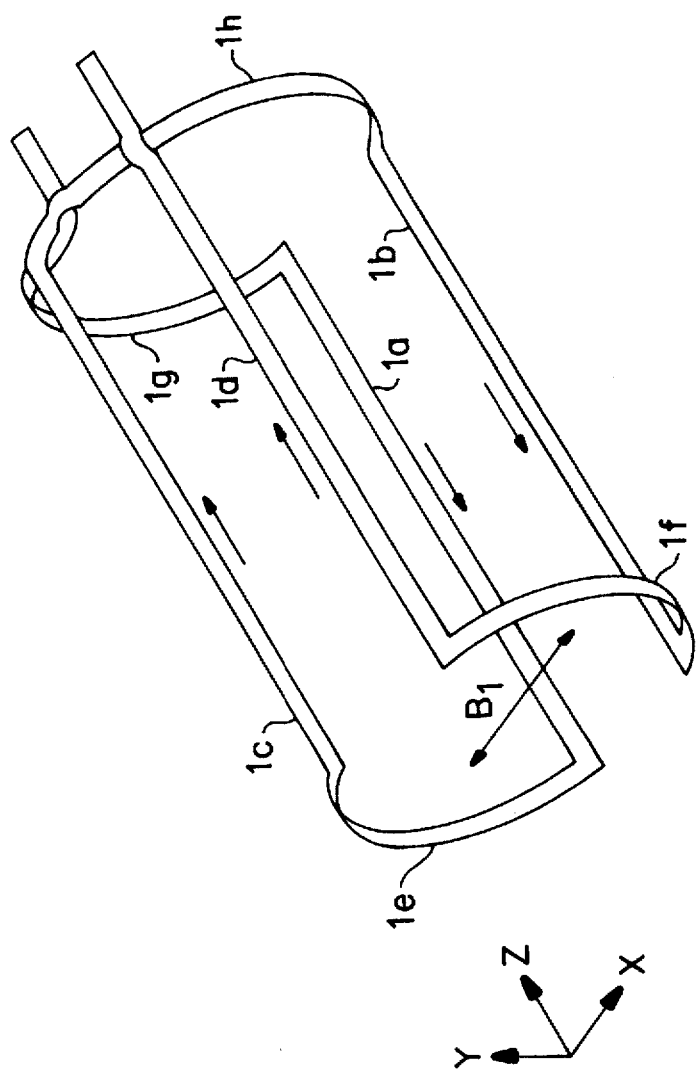
Figure 25:
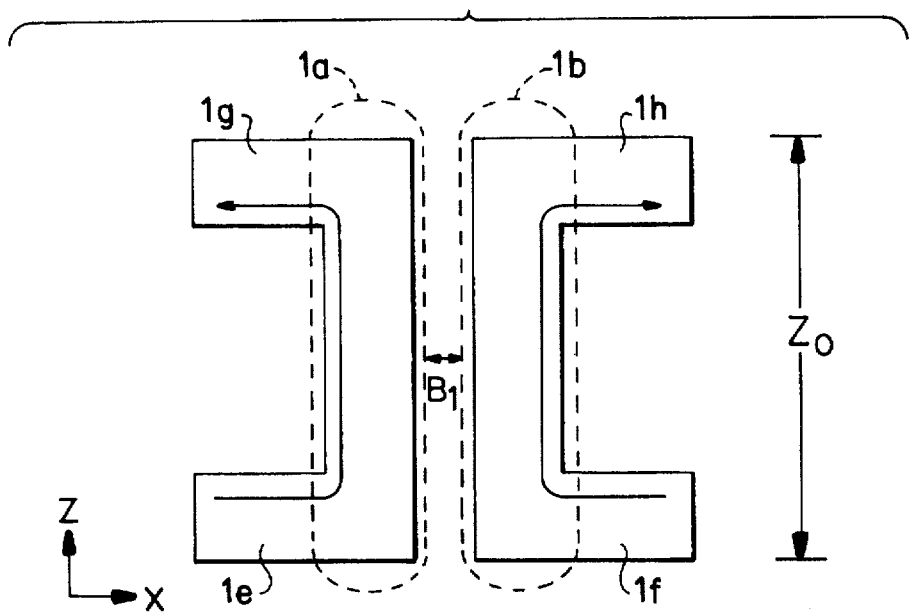
Figure 26:
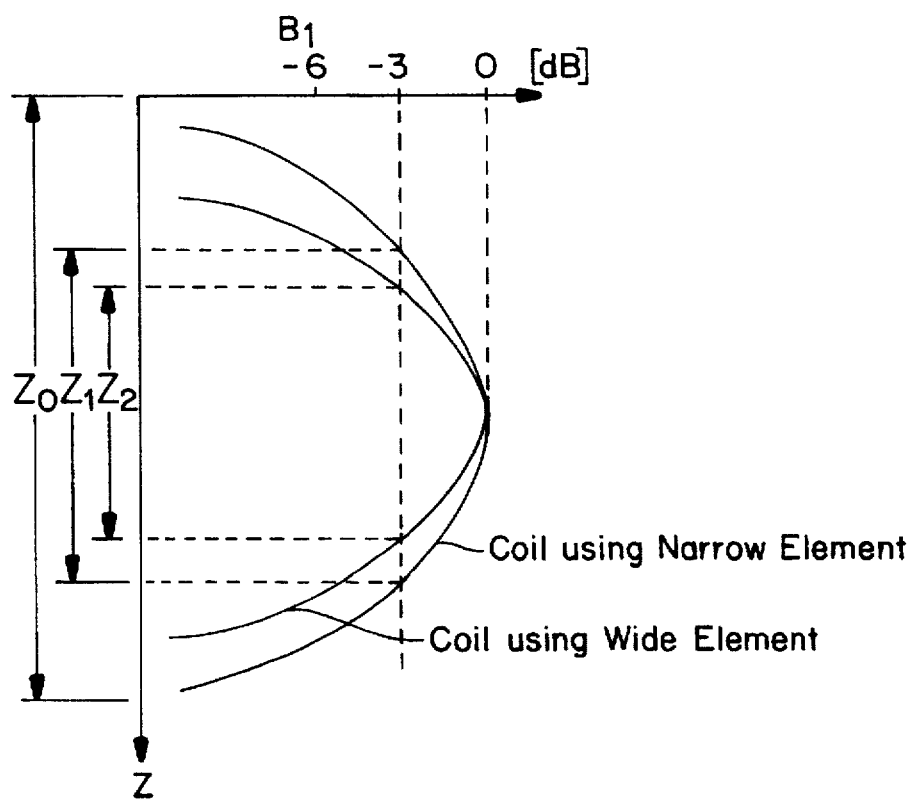
Figure 27A:
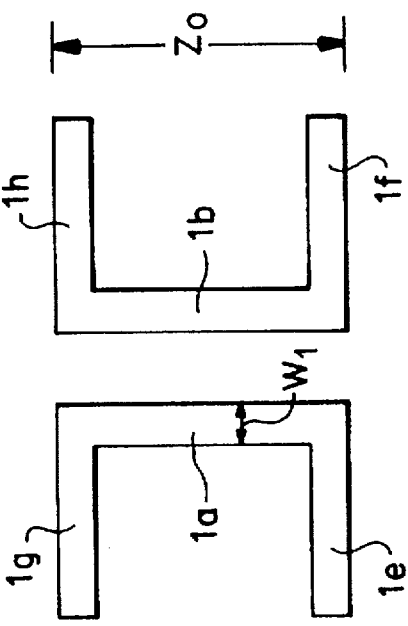
Figure 27B:
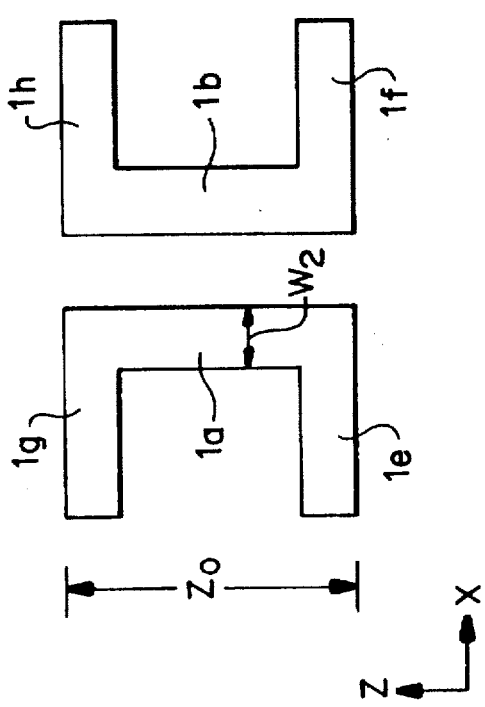
Figure 28:
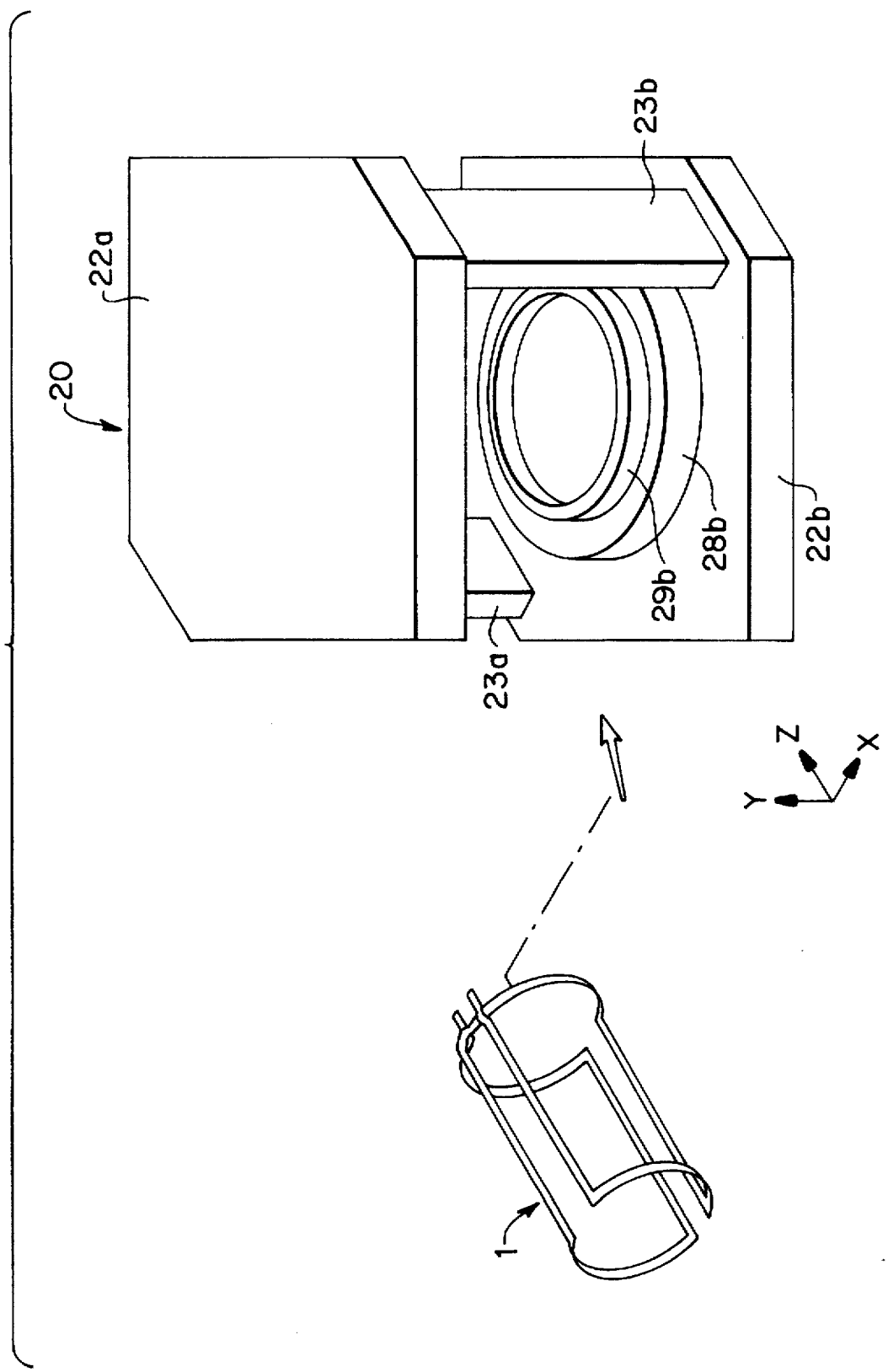

FIG. 18 is a view illustrating a structure of a coil according to a twelfth embodiment of the present invention, which makes use of a configuration in which main paths have been increased in length and the interval between adjacent equally-spaced connecting paths has been narrowed;

FIG. 19 is a configurational view depicting, together with a magnet assembly with two columns, a coil according to a thirteenth embodiment of the present invention, which uses a configuration in which main paths have been increased in length and the interval between adjacent equally-spaced connecting paths has been narrowed;

FIG. 20 is a view showing a structure of a principal portion of a coil according to a fourteenth embodiment of the present invention, which is provided with cuttable wiring patterns;

FIG. 21 is a view illustrating another structure of the principal portion of the coil shown in FIG. 20;

FIG. 22 is a view showing a structure of a principal portion of a coil according to a fifteenth embodiment of the present invention, which is equipped with a jumper;

FIG. 23 is a view illustrating another structure of the principal portion of the coil shown in FIG. 22;

FIG. 24 is a perspective view showing an overall structure of a conventional saddle coil;

FIG. 25 is a view depicting a structure of the conventional saddle coil;

FIG. 26 is a view illustrating characteristics related to a magnetic-field uniform region in the saddle coil having the conventional structure, in which a comparison has been made between different element widths;

FIG. 27(A) and 27(B) are views for describing the manner in which conventional saddle coils having different element widths are compared with each other; and FIG. 28 is a configurational view showing a conventional saddle coil together with a magnet assembly with two columns.

DETAILED DESCRIPTION OF THE PREFERRED EMBODIMENTS

Preferred embodiments of the present invention will hereinafter be described in detail with reference to the accompanying drawings. Incidentally, the present invention is not necessarily limited to or by these embodiments.

<Embodiments for achieving first object: modification of main path>

In order to achieve the object of the present invention, embodiments in which slits are defined in main paths or main path are modified, will be described below in accordance with the following paragraphs (1) through (8).

Figure 1:
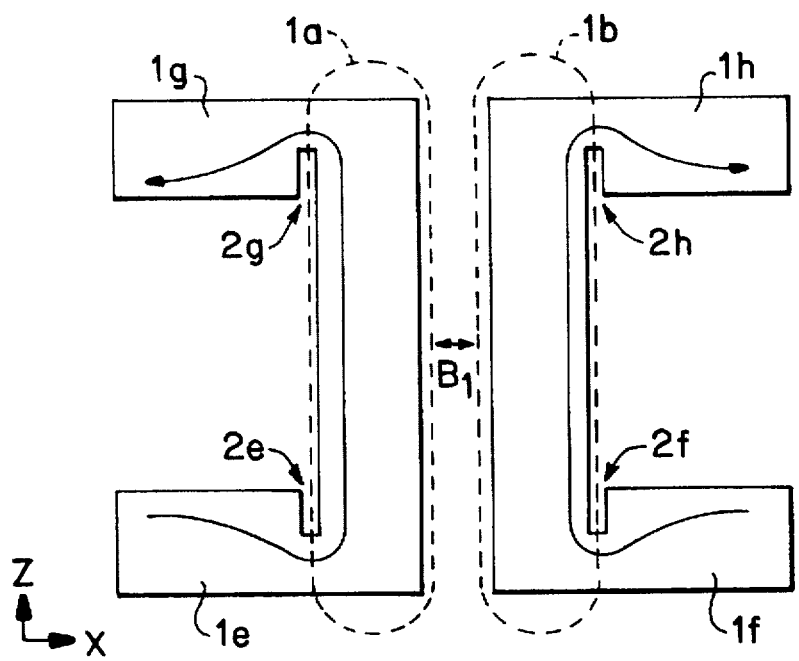
FIG. 1 is a view showing a structure of a saddle coil according to a first embodiment of the present invention, which make use of slits respectively parallel to main paths.

(1) Where slits extending in the directions of the main paths are respectively defined in connecting paths:

FIG. 1 is a view showing the structure of a first embodiment of the present invention. The same elements of structure as those shown in FIG. 25 are identified by like reference numerals.

In the present structure, a slit 2g parallel to a main path 1a is provided so as to extend from a connecting path in the vicinity of a region or area where the main path 1a and a connecting path 1g are connected to each other. A slit 2e parallel to the main path 1a is provided so as to extend from a connecting path in the vicinity of an area where the main path 1a and a connecting path 1e are connected to each other. These slits 2g and 2e are defined in the direction in which they extend outward each other.

In the present specification, an area extending in the end direction of the main path 1a (having a width $W_2$) sur-

12 rounded by a broken line in FIG. 1, i.e., a rectangular W2-long and W2-wide area where the connecting paths 1e and 1g (each having the width of $W_2$) are connected to each other, will now be called "area where the connecting path and the main path are connected to one another". A main path 1b and unillustrated main paths 1c and 1d will be also similar to the main path 1a.

A slit 2h parallel to the main path 1b is provided in the vicinity of a region or area where the main path 1b and a connecting path 1h are connected to each other. A slit 2f parallel to the main path 1b is provided in the vicinity of a region or area where the main path 1b and a connecting path 1f are connected to each other. These slits 2h and 2f are defined in the direction in which they extend outward each other.

Thus, since the current flows so that the current distribution reaches the maximum in the shortest route or path as described above, the provision of the slits provides the maximum current distribution in the shortest path of the neighborhood in which the slits are defined.

Therefore, a current distribution, which provides the maximum value, is represented in a pattern or shape indicated by arrow in FIG. 1 and hence the current distribution extends in the direction of each main path. It is therefore understood that the current distribution is spread at each end of the main path as compared with a coil using wide elements shown in FIG. 25.

Figure 2:
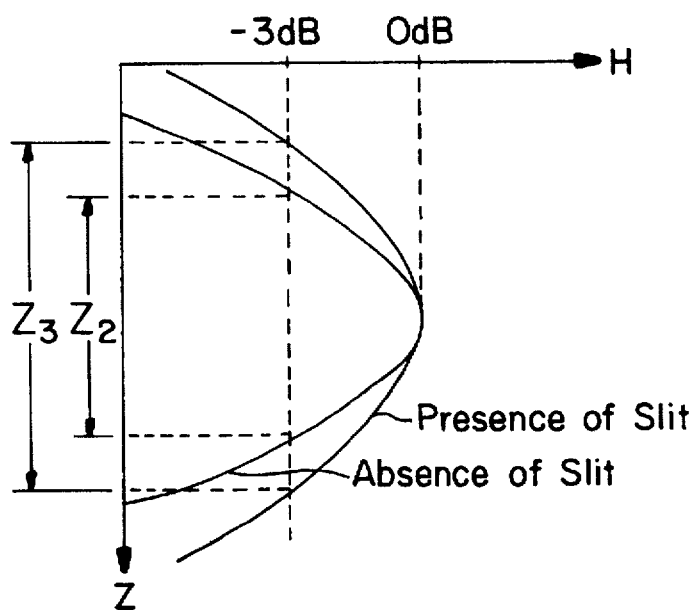
FIG. 2 is a view illustrating a characteristic related to a magnetic-field uniform region in the saddle coil having the structure shown in FIG. 1, which has been compared with a characteristic obtained in the conventional example.

Thus, when a range in which the strength of a magnetic field falls between 0dB and −3dB, is defined as a magnetic field uniform region, the magnetic field uniform region brought to $Z_2$ in the case of slit-free wide elements becomes, as shown in FIG. 2, a wide range as is represented in $Z_3$ ($>Z_2$) in the case of the use of wide elements with slits owing to the expansion of the current distribution in the direction parallel to each main path.

Since the respective slits 2g, 2e, 2h and 2f may be made narrow, the influence of the elements on shielding effects is small. Therefore, the effect of allowing a reduction in high-frequency power remains unchanged as compared with the conventional example.

Figure 3:
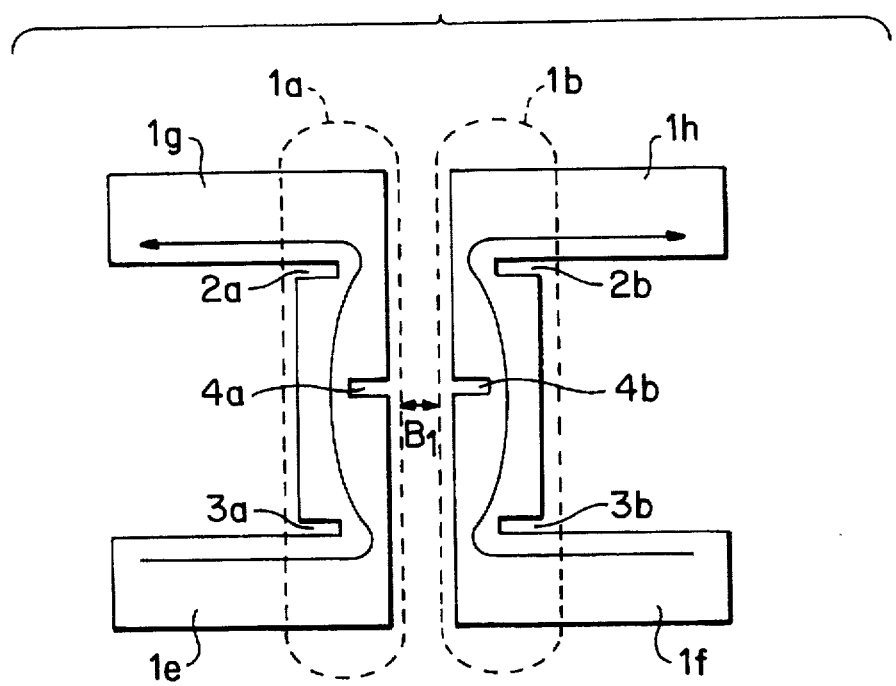
FIG. 3 is a view depicting a structure of a saddle coil according to a second embodiment of the present invention, which employs slits respectively parallel to connecting paths.

(2) Where slits extending in the direction of connecting paths are respectively defined in main paths:

FIG. 3 is a view illustrating the structure of a second embodiment of the present invention. The same elements of structure as those shown in FIG. 1 are identified by like reference numerals.

In the present structure, a slit 2a parallel to a connecting path 1g is provided in the vicinity of a region or area where a main path 1a and the connecting path 1g are connected to each other. A slit 3a parallel to a connecting path 1e is provided in the vicinity of an area where the main path 1a and the connecting path 1e are connected to each other.

A slit 4a is provided in the vicinity of the central portion of an element length of the main path 1a so as to extend in the direction of the connecting path 1g (1e) from the side opposed to the other main path 1b.

Further, a slit 2b parallel to a connecting path 1h is provided in the vicinity of an area where the main path 1b and the connecting path 1h are connected to one another. A slit 3b parallel to a connecting path 1f is provided in the vicinity of an area where the main path 1b and the connecting path 1f are connected to each other.

Furthermore, a slit 4b is provided in the vicinity of the central portion of an element length of the main path 1b so as to extend in the direction of the connecting path 1h (1f) from the side opposite to the other main path 1a.

Thus, as compared with the coil using the wide elements shown in FIG. 25, the current distribution reaches the maximum in the shortest path of the neighborhood in which each slit is defined. Therefore, the current distribution becomes such a current distribution that the interval between the main paths opposed to each other is lessened at the ends of the main paths as indicated by arrow in FIG. 3.

As a result, the distance between the main paths 1a and 1b opposed to each other becomes short in the vicinity of the ends of the main paths and hence a magnetic field formed by the ends of the main paths becomes strong. As the distance between the current distributions opposed to each other is away in the vicinity of the central portions of the main paths, the magnetic field at each central portion is slightly reduced in strength.

Figure 4:
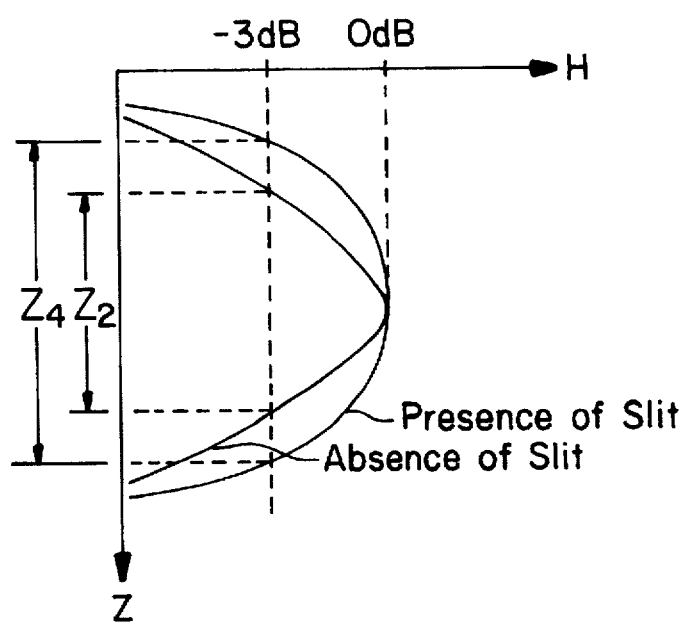
FIG. 4 is a view illustrating a characteristic related to a magnetic-field uniform region in the saddle coil having the structure shown in FIG. 3, which has been compared with a characteristic obtained in the conventional example.

Thus, as shown in FIG. 4, when a range in which the strength of the magnetic field falls between 0dB and −3dB, is defined as a magnetic field uniform region, the magnetic field uniform region brought to $Z_2$ in the case of slit-free wide elements becomes a wide range as is represented in $Z_4$ ($>Z_2$) where wide elements with slits are used, owing to a rise in magnetic field strength near the end of each main path.

Since the respective slits 2a through 4a and 2b through 4b may be made narrow, the influence of the elements on shielding effects is small. Therefore, the effect of allowing a reduction in high-frequency power remains unchanged as compared with the conventional example.

Figure 5:
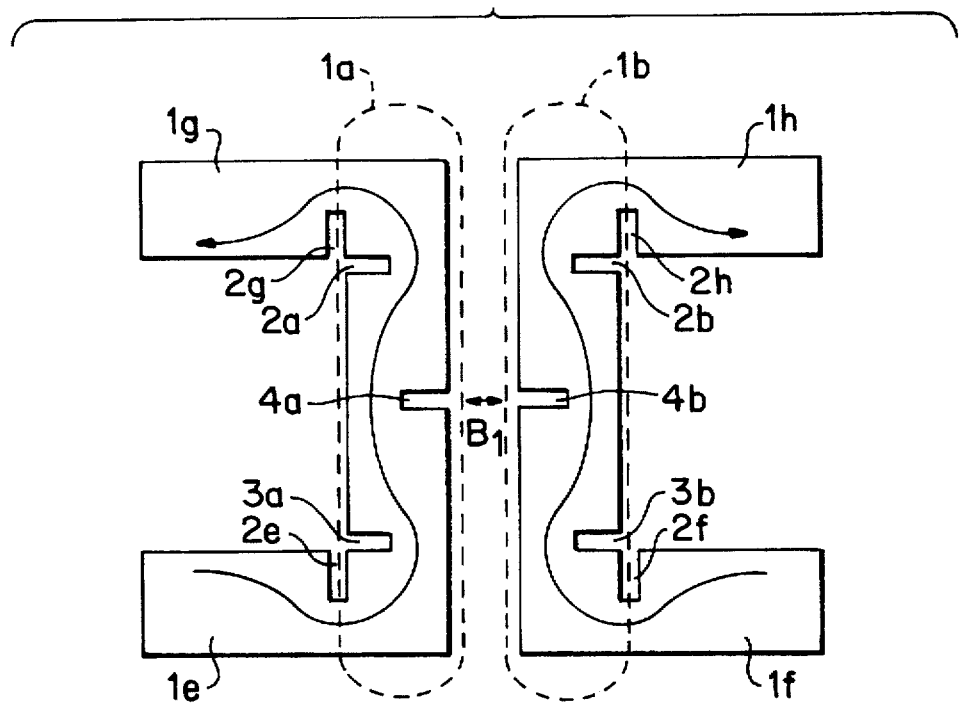
FIG. 5 is a view showing a structure of a saddle coil according to a third embodiment of the present invention, which employs slits respectively parallel to main paths and slits respectively parallel to connecting paths.

(3) Where slits extending in the direction of main paths are respectively defined in connecting paths and slits extending in the direction of connecting paths are respectively defined in main paths:

FIG. 5 is a view illustrating the structure of a third embodiment of the present invention. The same elements of structure as those shown in FIGS. 1 and 3 are identified by the same reference numerals.

In the present structure, a slit 2g parallel to a main path 1a and a slit 2a parallel to a connecting path 1g are provided in the vicinity of a region or area where the main path 1a and the connecting path 1g are connected to each other.

Further, a slit 2e parallel to the main path 1a and a slit 3a parallel to a connecting path 1e are provided in the neighborhood of an area where the main path 1a and the connecting path 1e are connected to each other.

Furthermore, a slit 4a is provided in the vicinity of the central portion of an element length of the main path 1a so as to extend in the direction of the connecting path 1g (1e) from the side opposed to other main path 1b.

Still further, a slit 2h parallel to the main path 1b and a slit 2b parallel to a connecting path 1h are provided in the vicinity of an area where the main path 1b and the connecting path 1h are connected to each other.

Still further, a slit 2f parallel to the main path 1b and a slit 3b parallel to a connecting path 1f are provided in the vicinity of an area where the main path 1b and the connecting path 1f are coupled to each other.

Still further, a slit 4b is provided in the vicinity of the central portion of an element length of the main path 1b so as to extend in the direction of the connecting path 1h (1f) from the side opposed to the other main path 1a.

Thus, as compared with the coil using the wide elements shown in FIG. 25, the current distribution reaches the maximum in the shortest path of the neighborhood in which each slit is defined. Therefore, the current distribution expands in the direction of each main path as indicated by arrow in FIG. 5 and becomes such a current distribution that the interval between the main paths opposed to each other is lessened at the ends of the main paths.

Figure 6:
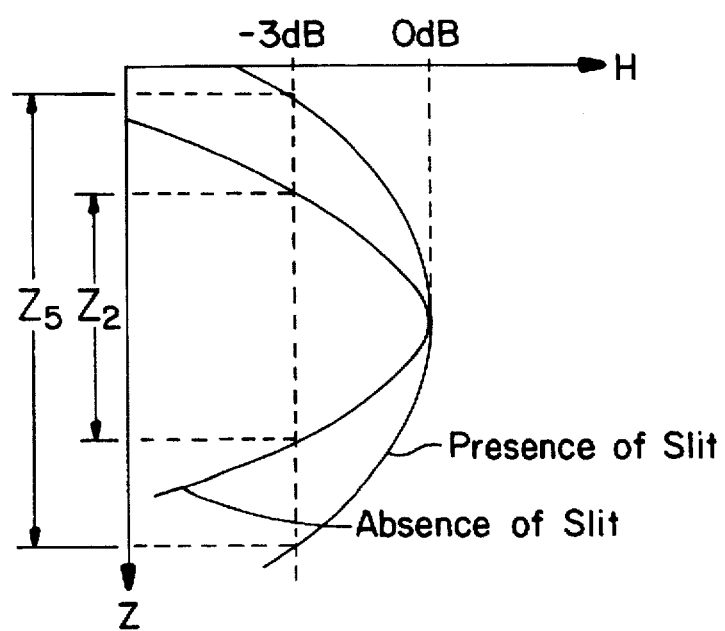
FIG. 6 is a view illustrating a characteristic related to a magnetic-field uniform region in the saddle coil having the structure shown in FIG. 5, which has been compared with a characteristic obtained in the conventional example.

As a result, owing to the expansion of the current distribution in the direction parallel to each main path and the reduction in distance between the main paths 1a and 1b opposed to each other in the vicinity of the ends of the main paths, a magnetic field formed by the end of each main path expands and is strengthened as shown in FIG. 6. As the distance between the current distributions opposed to each other is away in the vicinity of the central portions of the main paths, the magnetic field at each central portion is slightly reduced in strength.

Thus, when a range in which the strength of the magnetic field falls between 0dB and −3dB, is defined as a magnetic field uniform region, the magnetic field uniform region brought to $Z_2$ in the case of slit-free wide elements becomes a wide range as is represented in $Z_5$ ($>Z_2$) in the case of the use of wide elements with slits owing to a rise in and expansion of the magnetic field strength near the end of each main path.

Since the respective slits 2g, 2e, 2h, 2f and respective slits 2a through 4a and 2b through 4b may be made narrow, the influence of the elements on shielding effects is small. Therefore, the effect of allowing a reduction in high-frequency power remains unchanged as compared with the conventional example.

Figure 7:
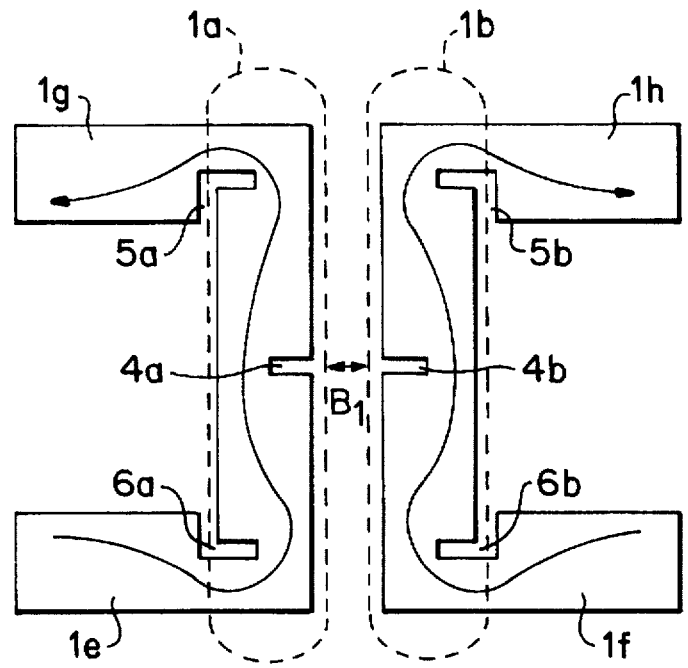
FIG. 7 is a view showing a structure of a saddle coil according to a fourth embodiment of the present invention, which uses slits respectively vertical and parallel to main paths.
Figure 8:
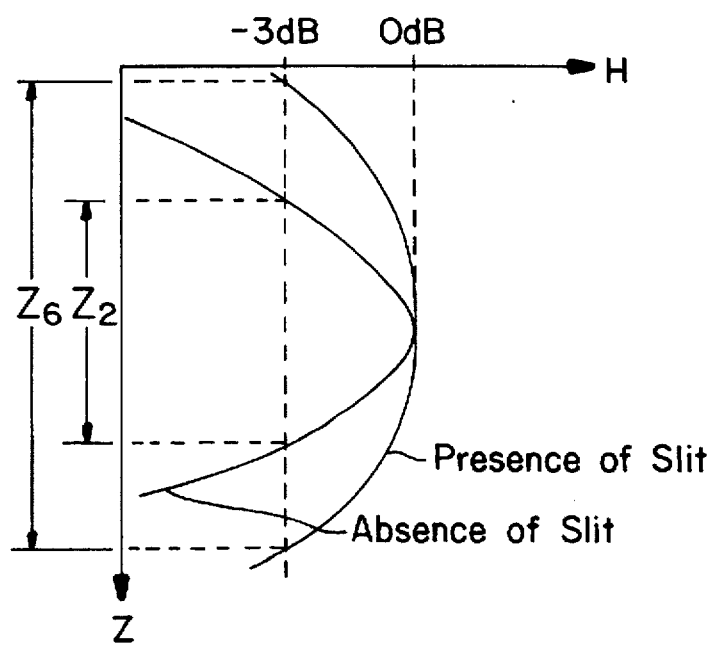
FIG. 8 is a view illustrating a characteristic related to a magnetic-field uniform region in the saddle coil having the structure shown in FIG. 7, which has been compared with a characteristic obtained in the conventional example.

(4) Where L-shaped slits utilizing main path directions and circular directions in combination are respectively defined in connecting paths:

FIG. 7 is a view showing the structure of a fourth embodiment of the present invention. The same elements of structure as those shown in FIGS. 1, 3 and 5 are identified by like reference numerals.

In the present structure, an L-shaped slit 5a having a groove provided so as to extend outward in parallel with a main path 1a and a groove provided so as to extend from the leading end of the former groove to the other main path 1b in parallel with a connecting path 1g is defined in the vicinity of an area where the main path 1a and the connecting path 1g are connected to each other.

Similarly, an L-shaped slit 6a having a groove provided so as to extend outward in parallel with the main path 1a and a groove provided so as to extend from the leading end of the former groove to the other main path 1b in parallel with a connecting path 1e is defined in the vicinity of an area where the main path 1a and the connecting path 1e are connected to each other.

Further, an L-shaped slit 5b having a groove provided so as to extend outward in parallel with the main path 1b and a groove provided so as to extend from the leading end of the former groove to the other main path 1a in parallel with a connecting path 1h is defined in the vicinity of an area where the main path 1b and the connecting path 1h are connected to each other.

Furthermore, an L-shaped slit 6b having a groove provided so as to extend outward in parallel with the main path 1b and a groove provided so as to extend from the leading end of the former groove to the other main path 1a in parallel with a connecting path 1f is defined in the vicinity of an area where the main path 1b and the connecting path 1f are connected to each other.

Still further, a slit 4a is provided in the neighborhood of the central portion of an element length of the main path 1a so as to extend in the direction of the connecting path 1g (1e) from the side opposed to the other main path 1b.

Still further, a slit 4b is provided in the neighborhood of the central portion of an element length of the main path 1b so as to extend in the direction of the connecting path 1h (1f) from the side opposed to the other main path 1a.

Thus, as compared with the coil using the wide elements shown in FIG. 25, the current distribution is brought to a maximum in the shortest path of the neighborhood in which each slit is defined. Therefore, the current distribution expands in the direction of each main path as indicated by arrow in FIG. 7 and becomes such a current distribution that the interval between the main paths opposed to each other is narrowed at the ends of the main paths.

As a result, owing to the expansion of the current distribution in the direction parallel to each main path and the reduction in distance between the main paths 1a and 1b opposed to each other in the vicinity of the ends of the main paths, a magnetic field formed by the end of each main path expands and is strengthened. As the distance between the current distributions opposed to each other is kept away in the vicinity of the central portions of the main paths, the magnetic field at each central portion is slightly reduced in strength.

Thus, when a range in which the strength of the magnetic field falls between 0dB and −3dB, is defined as a magnetic field uniform region, the magnetic field uniform region, which has remained at $Z_2$ in the case of slit-free wide elements, becomes a wide range as is represented in $Z_6$ (>$Z_2$) in the case of the use of wide elements with slits owing to a rise in and expansion of the magnetic field strength near the end of each main path.

Since the respective slits 5a, 5b, 6a, 6b, 4a and 4b may be made narrow, the influence of the elements on shielding effects is small. Therefore, the effect of allowing a reduction in high-frequency power remains unchanged as compared with the conventional example.

Since the slits extending in the direction of the connecting paths are provided further outward in this case as is seen even as compared with the case shown in FIG. 5, the distance between the main paths 1a and 1b opposed to each other is lessened in the further neighborhood of the ends of the main paths, so that a large effect can be obtained. Accordingly, the magnetic field uniform region also greatly expands.

Figure 9:
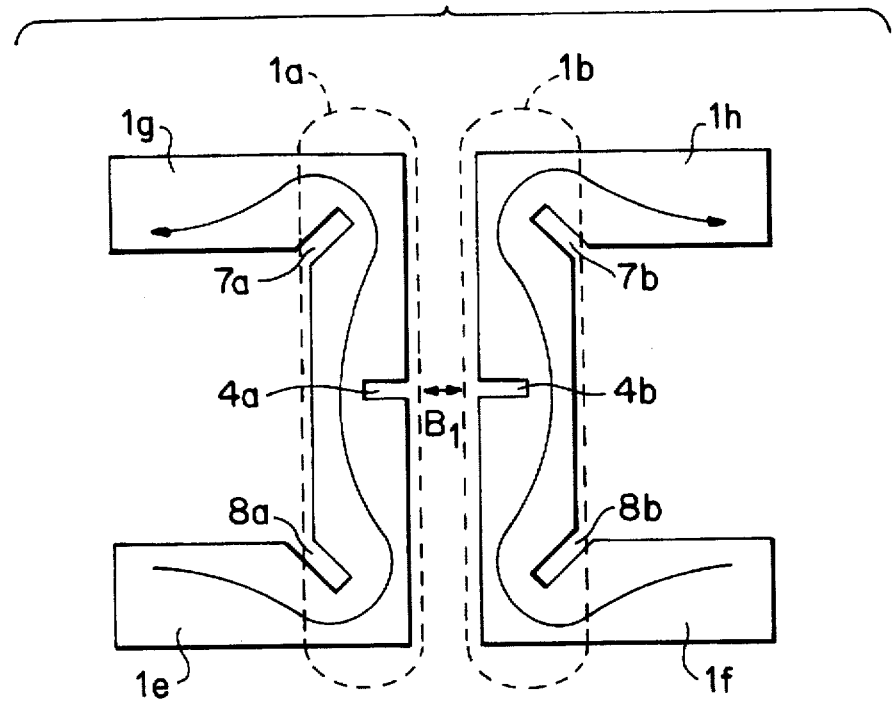
FIG. 9 is a view showing a structure of a saddle coil according to a fifth embodiment of the present invention, which makes use of slits for respectively dividing angles formed at portions where main paths and connecting paths are connected to one another, into equal parts.
Figure 10:
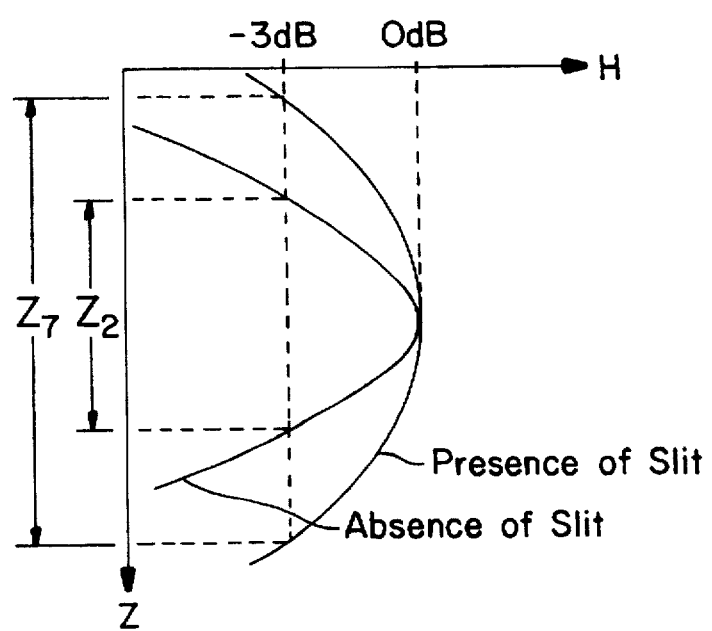
FIG. 10 is a view illustrating a characteristic related to a magnetic-field uniform region in the saddle coil having the structure shown in FIG. 9, which has been compared with a characteristic obtained in the conventional example.

(5) Where slits extending in slanting directions and in the direction of connecting paths are respectively defined in main paths:

FIG. 9 is a view showing the structure of a fifth embodiment of the present invention. The same elements of structure as those shown in FIGS. 1, 3 and 5 are identified by like reference numerals.

In the present structure, a slit 7a is formed from inside in the vicinity of a region or area where a main path 1a and a connecting path 1g are connected to each other, so as to extend in the direction in which an angle formed between the main path 1a and the connecting path 1g is divided substantially into two equal parts. Similarly, a slit 8a is formed from inside in the vicinity of an area where the main path 1a and a connecting path 1e are connected to each other, so as to extend in the direction in which an angle formed between the main path 1a and the connecting path 1e is divided substantially into two equal parts.

Further, a slit 7b is formed from inside in the vicinity of an area where a main path 1b and a connecting path 1h are connected to each other, so as to extend in the direction in which an angle formed between the main path 1b and the connecting path 1h is divided substantially into two equal parts.

Similarly, a slit 8b is formed from inside in the vicinity of an area where the main path 1b and a connecting path 1f are connected to each other, so as to extend in the direction in which an angle formed between the main path 1b and the connecting path 1f is divided substantially into two equal parts.

In addition, a slit 4a is provided in the neighborhood of the central portion of an element length of the main path 1a so as to extend in the direction of the connecting path 1g (1e) from the side opposed to the other main path 1b.

Furthermore, a slit 4b is provided in the neighborhood of the central portion of an element length of the main path 1b so as to extend in the direction of the connecting path 1h (1f) from the side opposed to the other main path 1a.

Thus, as compared with the coil using the wide elements shown in FIG. 25, the current distribution is brought to a maximum in the shortest path of the neighborhood in which each slit is defined. Therefore, the current distribution expands in the direction of each main path as indicated by arrow in FIG. 9 and becomes such a current distribution similar to that shown in FIG. 7 that the interval between the main paths opposed to each other is narrowed at the ends of the main paths.

As a result, owing to the expansion of the current distribution in the direction parallel to each main path and the reduction in distance between the main paths 1a and 1b opposed to each other in the vicinity of the ends of the main paths, a magnetic field formed by the end of each main path expands and is strengthened. As the distance between the current distributions opposed to each other is kept away in the vicinity of the central portions of the main paths, the magnetic field at each central portion is slightly reduced in strength.

Thus, when a range in which the strength of the magnetic field falls between 0dB and −3dB, is defined as a magnetic field uniform region, the magnetic field uniform region, which has remained at $Z_2$ in the case of slit-free wide elements, becomes a wide range as is represented in $Z_7$ (>$Z_2$) in the case of the use of wide elements with slits owing to the exhibition of a rise in and expansion of the magnetic field strength near the end of each main path.

Since the respective slits 7a, 7b, 8a and 8b, and 4a and 4b may be ones whose widths are narrow, the influence of the elements on shielding effects is small. Therefore, the effect of allowing a reduction in high-frequency power remains unchanged as compared with the conventional example.

Since the slits extending in the direction of the connecting paths are provided further outward in this case as is apparent even as compared with the case shown in FIG. 5, the distance between the main paths 1a and 1b opposed to each other is lessened in the further neighborhood of the ends of the main paths, so that a large effect similar to that obtained from FIG. 7 can be obtained. Accordingly, the magnetic field uniform region also greatly extends.

Figure 11:
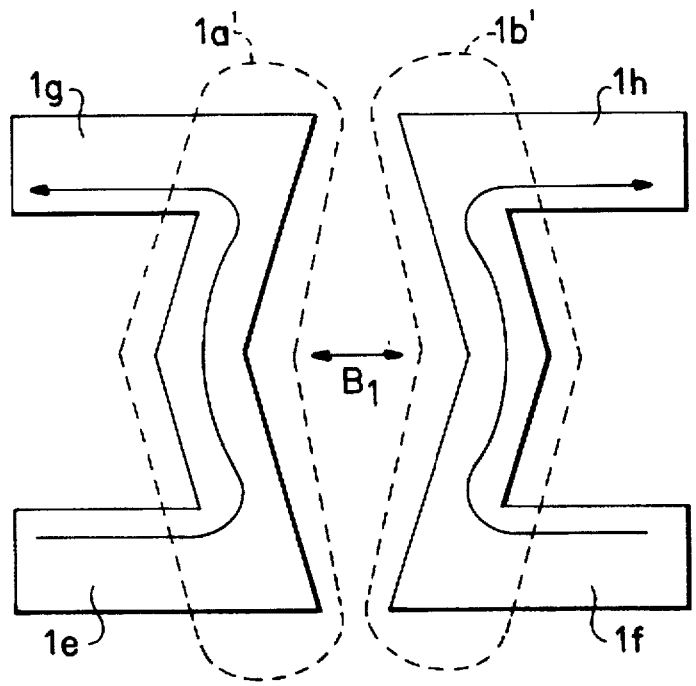
FIG. 11 is a view illustrating a structure of a saddle coil according to a sixth embodiment of the present invention, which makes use of a configuration in which the interval between main paths has been changed.

(6) Where main paths are modified and the interval therebetween is changed:

FIG. 11 is a view illustrating the structure of a sixth embodiment of the present invention. The same elements of structure as those shown in the drawings subsequent to FIG. 1 are identified by like reference numerals.

The present structure shows the case where the main path 1a and the main path 1b themselves are modified to change the current distributions. In FIG. 11, the current distributions are configured so as to become substantially identical to those shown in FIG. 3.

Namely, as an alternative to the use of the slits provided under the structure shown in FIG. 3, the distance between opposed main paths 1a' and 1b' is caused to approach at the ends thereof and the distance therebetween is kept away in the vicinity of the central portions of the main paths 1a' and 1b'.

In the present structure, each main path is doglegged but may be circular in shape. Further, the main path may be shaped in the form of part of a polygon. Alternatively, the main path may be formed in combination of parts of the circular shape and the polygon.

Thus, as compared with the coil using the wide elements shown in FIG. 25, the current distribution reaches the maximum in the shortest path of each modified element. Therefore, the current distribution becomes such a current distribution that the interval between the opposed main paths is narrowed at the ends thereof as indicated by arrow in FIG. 11.

As a result, the distance between the opposed main paths $1a'$ and $1b'$ is lessened in the vicinity of the ends of the main paths, whereby a magnetic field formed by the ends thereof is made strong. Further, since the distance between the opposed distributions is away in the vicinity of the central portions of the main paths, the magnetic field at each central portion is slightly reduced in strength.

Figure 12:
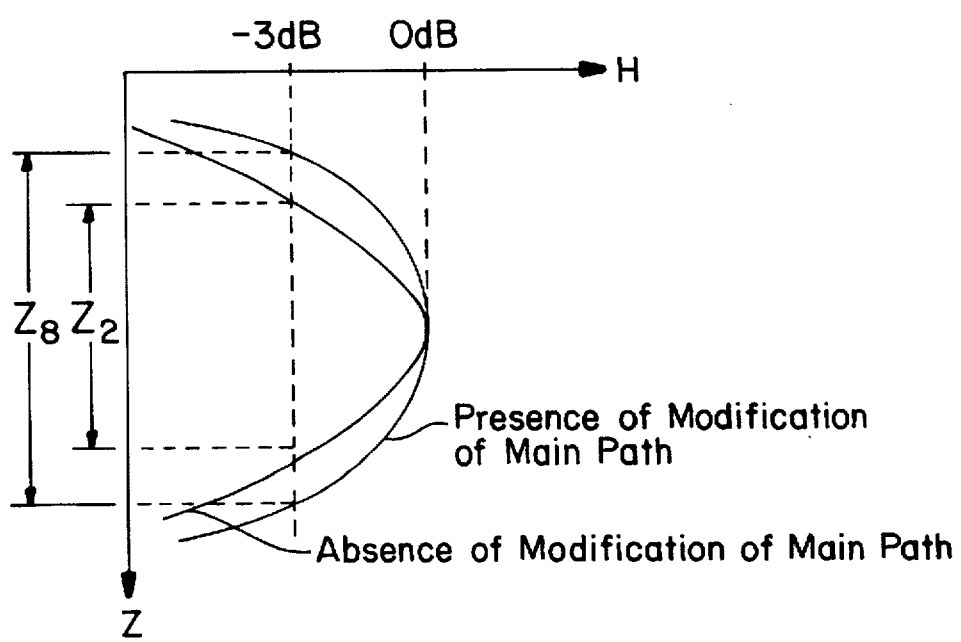
FIG. 12 is a view showing a characteristic related to a magnetic-field uniform region in the saddle coil having the structure shown in FIG. 11, which has been compared with a characteristic obtained in the conventional example.

Thus, as shown in FIG. 12, when a range in which the strength of the magnetic field falls between 0dB and −3dB, is defined as a magnetic field uniform region, the magnetic field uniform region, which has remained at $Z_2$ in the case of wide elements without having to modify the main paths, becomes a wide range as is represented in $Z_8$ ($>Z_2$) in the case of the use of wide elements with the modified main paths owing to a rise in magnetic field strength near the end of each main path.

Since no slits are provided in this case, the shielding effect of each element is substantially the same as the conventional one and the effect of allowing a reduction in high-frequency power remains unchanged as compared with the conventional example.

Figure 13:
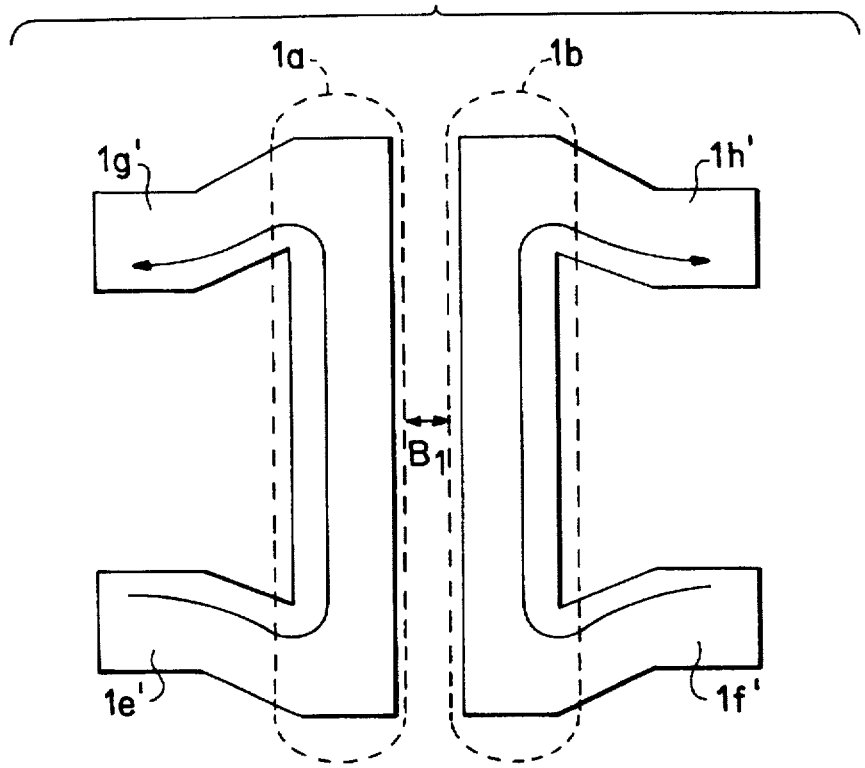
FIG. 13 is a view illustrating a structure of a saddle coil according to a seventh embodiment of the present invention, which utilizes a configuration in which main paths have been extended.

(7) Where main paths are extended:

FIG. 13 is a view showing the structure of a seventh embodiment of the present invention. The same elements of structure as those shown in FIG. 11 are identified by like reference numerals.

In the present structure, a main path $1a$ and a main path $1b$ themselves are extended so that element lengths of the main paths are longer than the interval (corresponding to the interval (hereinafter be called "interval between connecting paths") between elements constituting a pair of connecting paths) between each pair of connecting paths. Further, the connecting paths are modified to change current distributions.

In the structure shown in FIG. 13, the current distributions are configured so as to become substantially identical to the current distributions shown in FIG. 1. Namely, as an alternative to the use of the slits provided under the structure shown in FIG. 1, the main paths $1a$ and $1b$ are increased in length and portions where connecting paths $1g'$, $1e'$, $1h'$ and $1f$ are respectively connected to the main paths, are configured so as to expand.

Thus, the current distributions extending in the direction of the main paths expand as indicated by arrow in FIG. 13 as compared with the coil using the wide elements shown in FIG. 25.

Figure 14:
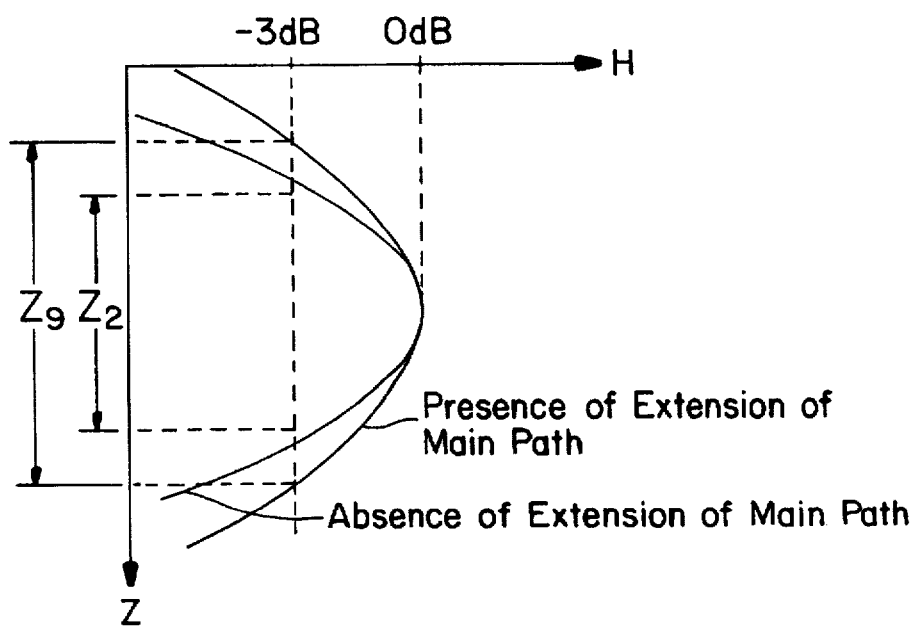
FIG. 14 is a view showing a characteristic related to a magnetic-field uniform region in the saddle coil having the structure shown in FIG. 13, which has been compared with a characteristic obtained in the conventional example.

As a result, when a range in which the strength of the magnetic field falls between 0dB and −3dB, is defined as a magnetic field uniform region, the magnetic field uniform region, which has remained at $Z_2$ in the case of wide elements without having to extend the main paths, becomes, as shown in FIG. 14, a wide range as is represented in $Z_9$ ($>Z_2$) in the case of the use of wide elements with the extended main paths owing to the expansion of the current distributions in the direction parallel to the main paths.

Since no slits are provided in this case, the shielding effect of each element is substantially the same as the conventional one and the effect of allowing a reduction in high-frequency power is identical to the conventional one.

Figure 15:
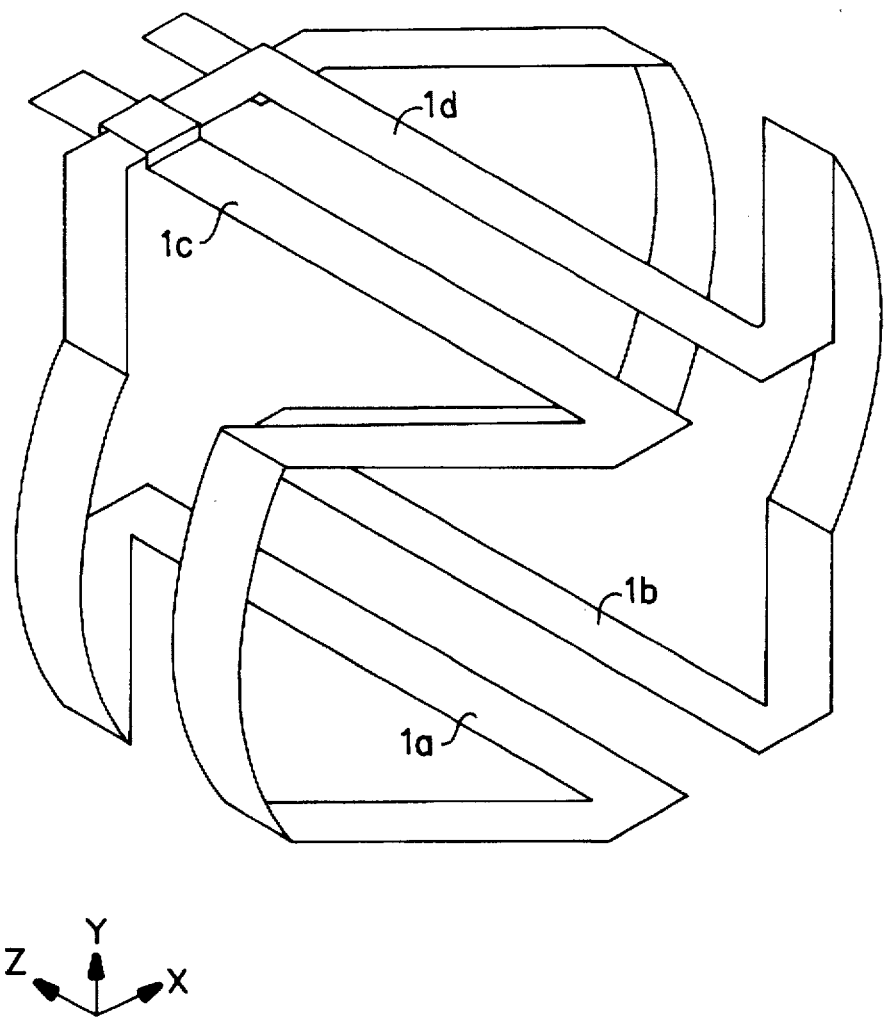
FIG. 15 is a view showing an overall structure of the saddle coil shown in FIG. 13.

Incidentally, the entire configuration of a saddle coil type RF coil for MRI, which makes use of the elements with the extended main paths, is shown in FIG. 15.

(8) Incidentally, the above embodiments have described the structures roughly divided into two comprising the structure in which the slits are provided and the structure in which the main paths are extended or modified. However, the slits may be provided in combination with the main paths increased in length or modified. In the case of the combination of the respective structures, their effects are combined into one.

Owing to the provision of the slits or the modification of the main paths, a substantial L component increases as compared with the conventional wide elements of simple shape. A C component can be reduced if the same tuning frequency is used in such a case.

Thus, since a blocking impedance Q ($=\omega L/R=1/\omega CR$, where R indicates the whole resistive component) can be increased, the efficiency of blocking can be enhanced and the loss of RF power can be reduced.

Owing to a synergistic effect of the effect of enhancing the efficiency of blocking and the effect of increasing the aforementioned magnetic field uniform region, the quality of an image obtained in an MRI apparatus is further improved as compared with the conventional one.

In the aforementioned embodiments, the element widths of the main path and the connecting path have been described as $W_2$. However, the widths of the main path and the connecting path may be made wider than the conventional width $W_1$ without having to be formed in the same width.

By constructing an apparatus for MRI, using the above RF coil for MRI, an MRI apparatus using the saddle coil of a type wherein the current distributions are optimized and the magnetic field uniform region are increased, can be materialized. Accordingly, the fourth object of the present invention can be achieved.

<Embodiments for Achieving Second Object: Improvement in Connecting Paths>

Embodiments each illustrative of a RF coil for MRI wherein the openability has been taken into consideration by contriving the shape of each connecting path in order to achieve the second object of the present invention, will next be described in accordance with the following paragraphs (9) through (13).

(9) Where main paths are extended and connecting paths each having an interval narrower than the length of each main path are provided along columnar yokes of a magnet assembly with two columns or posts:

The connecting paths of the saddle coil type RF coil for MRI, which is shown in FIGS. 13 and 15, are further modified and equally-spaced connecting paths are configured so as to extend along two columnar yokes of a magnet assembly 20 shown in FIG. 28. A saddle coil type RF coil 10 for MRI, according to the present embodiment constructed in this way, will be shown in FIG. 16.

In the RF coil 10 for MRI, two pairs of saddles are used so that portions regarded as mountains or hills of the saddles are provided so as to extend outward each other. Further, the interval between the portions is made narrow and placed in parallel and the portions are configured in combination so that a space extending in an X-Y direction is formed as rectangular.

Figure 16:
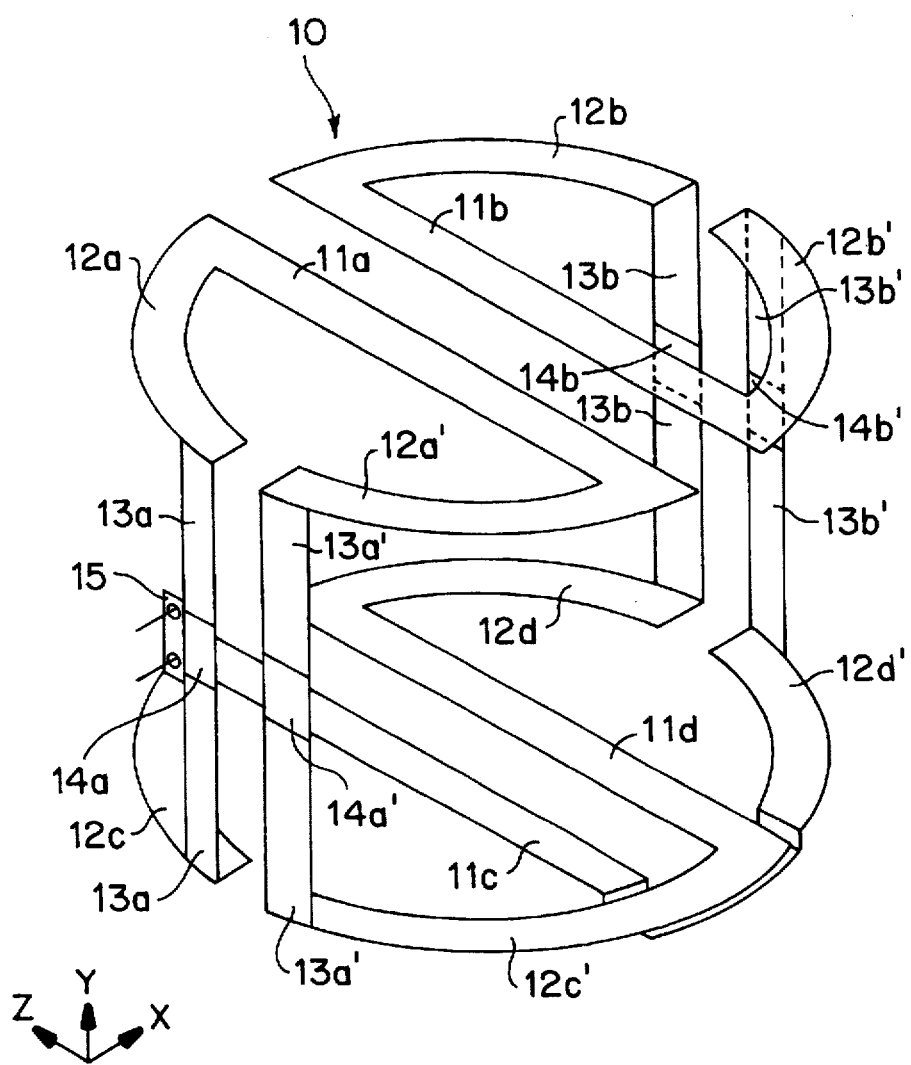
FIG. 16 is a view illustrating a structure of a coil according to a ninth embodiment of the present invention, which makes use of a configuration in which main paths have been increased in length and the interval between adjacent equally-spaced connecting paths has been narrowed.

Accordingly, the RF coil 10 for MRI shown in FIG. 16 electrically serves equivalently to a conventional saddle coil shown in FIG. 24. Incidentally, the RF coil 10 is configured so as to be supplied with power from a power supply portion 15.

A body to be inspected is to be placed in a space surrounded by the RF coil 10 with a Z-axis direction as the longitudinal direction of the RF coil 10.

Now, each of adjacent main paths 11a and 11b extending in the Z direction is configured so as to assume the same current direction. Similarly, each of adjacent main paths 11c and 11d is configured so as to take the direction opposite to the current direction assumed by each of the main paths 11a and 11b.

A magnetic field B1 is produced in the X direction shown in FIG. 16 by a current that flows through each of elements constituting the main paths 11a, 11b, 11c and 11d.

Further, connecting paths for connecting these main paths to each other comprise equally-spaced connecting paths 13a and 13a' and 13b and 13b' along which the opposed elements extend in parallel to each other and unequally-spaced connecting paths 12a through 12d for respectively providing connections between the ends of the main paths and the equally-spaced connecting paths. Furthermore, the unequally-spaced connecting paths and the main paths are formed so as to configure semicircles or triangles.

Thus, as has been already shown in FIG. 14, when the magnetic field uniform region, which has remained at $Z_2$ in the case of the wide elements without having to extend the main paths, becomes a wide range as is represented in $Z_9$ ($>Z_2$) in the case of the use of the wide elements with the extended main paths owing to the expansion of the current distributions in the direction parallel to the main paths.

Namely, since the lengths of the main paths extend so as to be greater than the interval between the connecting paths in the RF coil 10 for MRI, current distributions of the main paths expand in the direction of the main paths. Thus, the magnetic field is spread at the end of each main path, so that the magnetic field uniform region is enlarged.

The unequally-spaced connecting paths respectively connected to the ends of the main paths may preferably be connected to the main paths at right angles. The circular configurations may preferably be used as shown in FIG. 16 in order to connect between the unequally-spaced paths and the main paths at right angles at the portions where they are connected to one another in this way and connect the main paths to the equally-spaced connecting paths provided with a narrow interval defined therebetween.

Owing to the connection between the main paths and the equally-spaced connecting paths substantially at right angles, they are not magnetically coupled to each other. It is therefore possible to prevent a magnetic flux developed in each unequally-spaced connecting path from exerting an influence on each main path.

Figure 17:
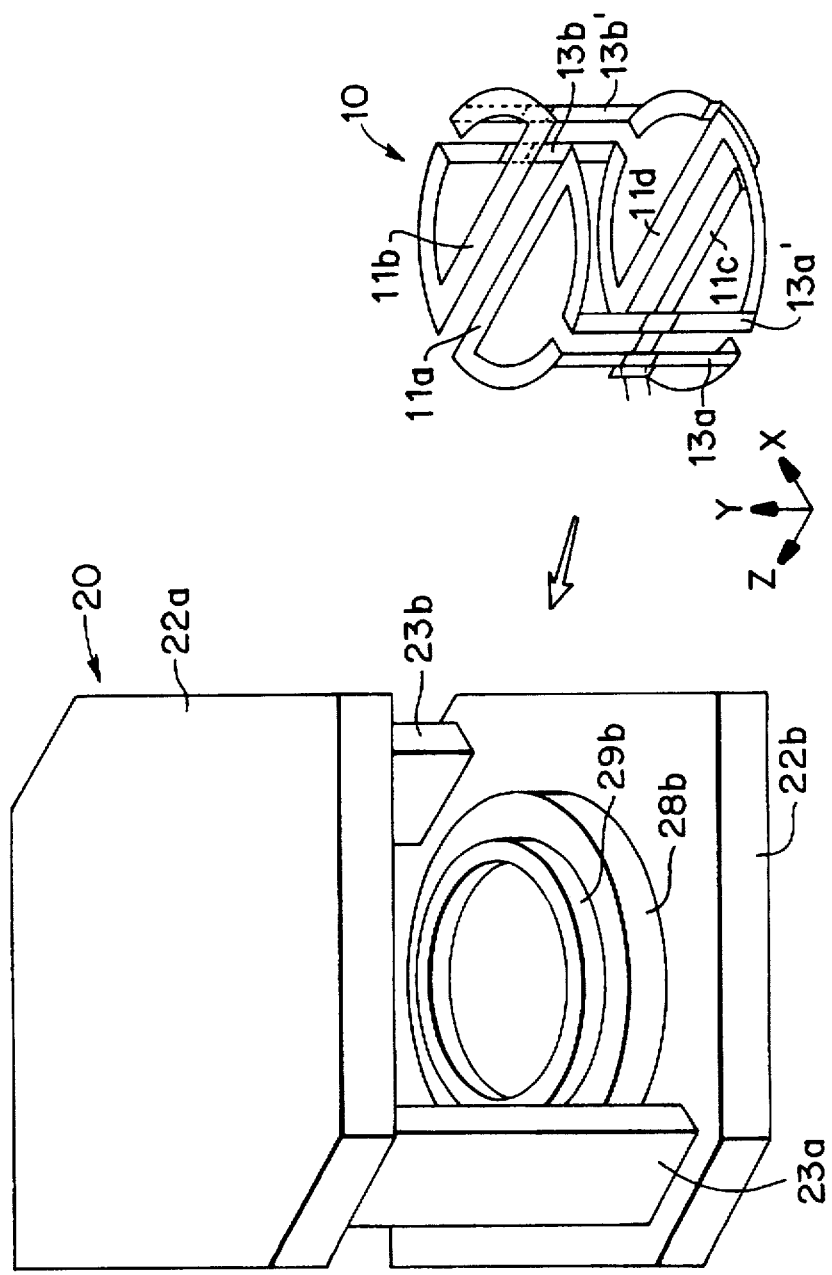
FIG. 17 is a configurational view showing the coil shown in FIG. 16 together with a magnet assembly with two columns.

Thus, as shown in FIG. 17, main paths 11a and 11b are placed along a magnetic shunt adjusting plate on the base yoke 22a side of a magnet assembly 20. Main paths 11c and 11d are disposed along a magnetic adjusting plate 29b on the base yoke 22b side. Equally-spaced connecting paths 13a and 13a' are placed along a columnar yoke 23a and equally-spaced connecting paths 13b and 13b' are disposed along a columnar yoke 23b.

Namely, in the magnet assembly 20 in which the upper and lower base yokes 22a and 22b are supported by the two columnar yokes 23a and 23b, since the equally-spaced connecting paths 13a and 13a' and 13b and 13b' are configured so as to be provided along the two columnar yokes 23a and 23b, the present assembly is superior in openability to a saddle coil whose outer shape is cylindrical, and hence the openability of the magnet assembly 20 with the two columns or posts is not impaired.

Accordingly, the RF coil for MRI, which is excellent in openability, can be materialized using the saddle coil capable of optimizing the current distributions and expanding the magnetic field uniform region.

In the structure shown in FIG. 16, a portion at which the unequally-spaced connecting paths 12c' and 12d' overlap each other, is formed. However, the portion may preferably be formed thinner to avoid the generation of an unnecessary electrostatic capacity at the overlapping portion. Further, the portion may preferably be composed of a thick material to prevent an electrical resistance from increasing due to such a thin construction.

(10) The slits shown in FIGS. 1, 3, 5, 7 and 9 may be provided in the vicinity of regions or areas where the connecting paths and main paths of the RF coil 10 for MRI described in the paragraph (9) are respectively connected to each other. This is effective at expanding the magnetic field uniform region.

(11) Further, the interval (corresponding to the intervals between the main paths 11a and 11b and between the main paths 11c and 11d) between the adjacent main paths of the RF coil 10 for MRI described in the paragraph (9) may be configured so as to vary at the ends and the central portion as illustrated in FIG. 11. This is effective at increasing the magnetic field uniform region.

(12) Furthermore, the present RF coil may be configured as an MRI RF coil of such a type that the unequally-spaced connecting paths 12a through 12d are configured linearly as an alternative to the circular configurations and triangles are formed by main paths and unequally-spaced connecting paths as shown in FIG. 18.

Namely, the RF coil can be constructed according to the shapes of the upper and lower base yokes of the magnet assembly 20. Thus, even in this case, a RF coil for MRI, which is excellent in openability, can be achieved using a saddle coil capable of optimizing current distributions and expanding a magnetic field uniform region.

Even in the case of the RF coil for MRI shown in FIG. 18, the interval between the main paths can be changed at the central portion and the ends. Further, slits may be defined in portions where the main paths and the unequally-spaced connecting paths are connected to one another. Thus, the effect of further increasing the magnetic field uniform region can be obtained.

(13) According to the shape of a magnet assembly 20' in which columnar yokes 23a and 23b are expanded in the transverse direction (i.e., in the X-axis direction) as shown in FIG. 19, equally-spaced connecting paths of a RF coil 10' for MRI may be provided even in the X-axis direction so as to extend along base yokes.

Namely, the present embodiment is basically identical to the embodiment described in the paragraph (9) in that the central portions of the equally-spaced connecting paths whose lengths are shorter than those of main paths, are configured along the columnar yokes of the magnet assembly.

Owing to such a construction, the present RF coil is excellent in openability as compared with the saddle coil whose outer shape is cylindrical. Hence the openability of the magnet assembly 20' with the two columns or posts is not impaired. Accordingly, a RF coil for MRI, which is excellent in openability, can be materialized using a saddle coil capable of optimizing current distributions and expanding a magnetic field uniform region.

Further, even in the case of the RF coil for MRI shown in FIG. 18, the equally-spaced connecting paths may be configured so as to extend in the X-axis direction. Thus, a RF coil for MRI, which is excellent in openability, can be achieved using a saddle coil capable of optimizing current distributions and expanding a magnetic field uniform region.

Owing to the use of the aforementioned RF coil for MRI in the magnet assembly 20 having the two posts, an MRI apparatus excellent in openability can be materialized using a saddle coil capable of optimizing current distributions and expanding a magnetic field uniform region. Accordingly, the fourth object of the present invention can be achieved.

<Embodiments for Achieving Third Object: Improvement in Frequency Adjustment>

In order to improve a problem on an adjustment to the frequency for the conventional RF coil for MRI, embodiments each illustrative of a RF coil for MRI, which has a new structure for making a frequency adjustment, will next be described in accordance with the following paragraphs (14) through (16).

(14) Where cuttable wiring patterns are provided:

The present embodiment will be described with reference to FIG. 20. The neighborhood of the capacitor portion 14a of the RF coil for MRI shown in FIG. 16 will now be described in an enlarged manner. Incidentally, other capacitor portions 14a', 14b and 14b' are identical in configuration to the capacitor portion 14a.

In the embodiment shown in FIG. 20, three capacitors 140 are parallel-disposed between elements constituting equally-spaced connecting paths 13a as tuning capacitors. Since chip parts are illustrated by way of example here, terminals 140a and 140b are soldered to their corresponding equally-spaced connecting paths 13a.

Further, extension paths 130A and 130B are attached to their corresponding equally-spaced connecting paths 13a at right angles to the longitudinal direction thereof. Furthermore, four tuning capacitors are provided between the extension paths 130A and 130B and further soldered thereto so as to be provided in parallel with the three tuning capacitors.

The extension paths 130A and 130B can be cut at any positions indicated by broken lines so as to vary the total or composite capacitance of the electrically-connected capacitors.

Thus, the tuning capacitors are disposed in advance so as to provide an electrostatic capacity larger than an expected value and patterns of the extension paths 130A and 130B are cut at any positions indicated by the broken lines at the adjustment stage, whereby the total capacitance of the capacitors can be adjusted low.

As a result, a large adjustment range can be obtained as compared with variable capacitance capacitors such as a trimmer capacitor, etc. Thus, a RF coil for MRI can be materialized which is easy to adjust a large or high frequency range.

Incidentally, the number of the capacitors shown here is illustrated as one example but may be changed as needed. If the extension paths 130A and 130B are formed by thin copper foil patterns, then they can be easily cut with means like a cutter knife or the like. Accordingly, an adjustment operation can be easily carried out.

As shown in FIG. 21, lands 131A through 131C may be provided so that parallel-connected capacitor groups (seven in FIG. 20) can be series-connected to one another. FIG. 21 shows the manner in which no capacitors have been disposed. In the present embodiment, the seven parallel-connected capacitor groups can be connected in four-series combinations. Since the parallel and series combinations are made in this case, the capacity can be finely adjusted according to the result of combinations.

(15) Where switch means are provided:

An embodiment using jumper pins and jumper switches as the switch means will be described with reference to FIG. 22. The neighborhood of the capacitor portion 14a for the RF coil for MRI shown in FIG. 16 will be described in an enlarged form here. Incidentally, other capacitor portions 14a', 14b and 14b' are identical in configuration to the capacitor portion 14a.

In the embodiment shown in FIG. 22, three capacitors 140 are parallel-provided between elements for equally-spaced connecting paths 13a as tuning capacitors. Since chip parts are illustrated by way of example here, terminals of the capacitors 140 at both ends thereof are soldered to their corresponding equally-spaced connecting paths 13a.

Further, lands 132A and 132B are attached to their corresponding equally-spaced connecting paths 13a at positions perpendicular to the longitudinal direction of the connecting paths 13a. Incidentally, the lands 132A and 132B are not electrically connected to the corresponding equally-spaced connecting paths 13a and each capacitor 140 is soldered between the lands 132A and 132B.

A jumper pin 133A is electrically connected to the land 132A. Further, a jumper pin 133A' is electrically connected to above the equally-spaced connecting path 13a on the side opposed to the jumper pin 133A.

Similarly, a jumper pin 133B is electrically connected to the land 132B. Further, a jumper pin 133B' is electrically connected above the equally-spaced connecting path 13a on the side opposed to the jumper pin 133B.

Further, the four capacitors 140 in total are parallel-connected to each other by bringing the jumper pins 133A and 133A' into conduction by a jumper-switch 134A and bringing the jumper pins 133B and 133B' into conduction by a jumper switch 134B.

Thus, a RF coil for MRI can be realized wherein electrically connectable and cuttable capacitors are also connected to the equally-spaced connecting paths through the jumper pins and jumper switches as well as the three capacitors which have been connected between the elements in advance, the capacitances of the tuning capacitors can be adjusted by connecting or disconnecting the jumper switches and a large frequency range can be easily adjusted.

In this case, the connections and separation between the capacitors can be freely repeated unlike the aforementioned separation by cutting. Further, an adjustment operation is also extremely easy because of the insertion and extraction of the jumper pins.

Since a number of tuning capacitors are further connected in parallel combinations as shown in FIG. 23, lands and jumper pins can be also provided. In doing so, the adjustment range is further expanded. Further, the thus parallel-connected capacitor groups may be connected in series-combinations.

As the switch means, may be used various switches such as a toggle switch, a dip switch or a relay, etc. other than the jumper pins and the jumper switches illustrated herein.

In the case of various switches usable in a frequency (Larmor frequency) in a high-frequency magnetic field, which is employed in an MRI apparatus, switches other than those illustrated herein may be used.

(16) Where through-holes are defined:

When the reverse side of each equally-spaced connecting path 13a shown in FIGS. 20 through 23 is good in operability upon adjustment in the case of the frequency adjustment by the cuttable patterns described in the paragraph (14) and the jumpers described in the paragraph (15), tuning capacitors may be disposed (additionally provided) by defining through-holes in each equally-spaced connecting path 13a and providing cuttable patterns and jumpers on the reverse side.

Namely, the tuning capacitors are provided so as to correspond to the fixed tuning capacitors together with the patterns cuttable on the reverse side and the jumpers in order to make the operability satisfactory.

The tuning capacitors at the extension paths and the tuning capacitors at the lands are provided on the same side as the tuning capacitors on the equally-spaced connecting paths 13a. In this condition, the patterns and the jumper pins may be provided on the reverse side only for cutting.

It is also possible to provide the extension paths and the lands on both surfaces and increase the number of the tuning capacitors for extension. In doing so, the adjustment range can be further increased.

(17) Upon adjusting the capacitances of the tuning capacitors described in the paragraphs (14) through (16), the capacitances of the respective capacitor portions (14a through 14b') at the four points shown in FIG. 16 may be individually adjusted according to the interval between RF shields.

(18) Owing to the formation of an MRI apparatus by the use of each RF coil for MRI referred to above, an MRI apparatus can be materialized which is easy to adjust a large frequency range. Accordingly, the fourth object of the present invention can be achieved.

Incidentally, the above description is related to the case where the magnet assembly with the two columns or posts is used. Since the tuning capacitors can be adjusted in the vicinity of the central portions of the columnar yokes, workability is satisfactory.

Namely, even after the installation of the MRI apparatus, the tuning capacitors can be adjusted by respectively mounting caps or the like to outer covers in the neighborhood of the central portions of the two columnar yokes. Thus, since the cap may be provided at one place for each columnar yoke, the RF coil can be simplified in structure. Since the tuning capacitors can be adjusted by cutting the extension paths or operating the switches, the caps to be provided can be reduced in size.

By employing the RF coil for MRI according to each embodiment of the present invention even in the conventional magnet assembly using the four columnar yokes or other type magnet assembly and adjusting the tuning capacitors using the extension paths or the switch means, advantageous effects can be brought about that a frequency range can be enlarged and workability can be improved.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. An RF coil suitable for use in an MRI apparatus, said RF coil having a saddle configuration and comprising:
   a plurality of main conductors disposed parallel to each other and located at ends of said saddle configuration; and
   a plurality of connecting conductors connecting said plurality of main conductors to each other and being disposed at at least a top of said saddle configuration and having an interval between adjacent ones of said plurality of connecting conductors;
   wherein the length of each of said plurality of main conductors is greater than said interval between said connecting conductors.

2. The apparatus of claim 1, wherein the lengths of said main conductors are equal to each other.

3. The apparatus of claim 1, wherein the plurality of main conductors comprises two pairs.

4. An RF coil suitable for use in an MRI apparatus, said RF coil having a saddle configuration and comprising:
   a plurality of main conductors disposed parallel to each other and located at ends of said saddle configuration; and
   a plurality of connecting conductors connecting said plurality of main conductors to each other and being disposed at least at a top of said saddle configuration;
   wherein said plurality of connecting conductors comprise:
     a plurality of conductors equally spaced from each other and extending parallel to each other, and
     a plurality of conductors non-equally spaced from each other and connecting ends of said plurality of main conductors to said plurality of equally spaced conductors; and
   wherein said equally spaced conductors are disposed so that intervals between adjacent ones of said equally spaced conductors are shorter than lengths of said plurality of main conductors.

5. An MRI apparatus comprising:
   a magnet assembly comprising:
     base yokes provide with magnets, and
     two columnar yokes disposed at the periphery of said base yokes and supporting said base yokes to be vertically opposed to each other; and
   an RF coil disposed inside said magnet assembly, said RF coil having a saddle configuration and comprising:
     a plurality of main conductors disposed parallel to each other and located at ends of said saddle configuration, and
     a plurality of connecting conductors connecting said plurality of main conductors to each other and being disposed at least at a top of said saddle configuration and having an interval between adjacent ones of said plurality of connecting conductors, wherein lengths of each of said plurality of main conductors are greater than said interval between said connecting conductors.

6. An MRI apparatus comprising:
   a magnet assembly comprising:
     base yokes provided with magnets, and
     two columnar yokes disposed at the periphery of said base yokes and supporting said base yokes to be vertically opposed to each other; and
   an RF coil disposed inside said magnet assembly, said RF coil having a saddle configuration and comprising:
     a plurality of main conductors disposed parallel to each other and located at ends of said saddle configuration, and
     a plurality of connecting conductors connecting said plurality of main conductors to each other and being dispose at least at a top of said saddle configuration, wherein
     said plurality of connecting conductors comprise:
       a plurality of conductors equally spaced from each other and extending parallel to each other, and
       a plurality of conductors non-equally spaced from each other and connecting ends of said plurality of main conductors to said plurality of equally spaced conductors, and wherein said equally spaced conductors are disposed so that intervals between adjacent ones of said equally spaced conductors are shorter than the lengths of said plurality of main conductors.

7. The apparatus of claim 6, wherein said equally spaced conductors are disposed along said two columnar yokes.

8. The apparatus of claim 6, wherein said non-equally spaced conductors are disposed respectively along said magnets provided on said base yokes, and said equally spaced conductors are disposed at least along said two columnar yokes.

9. The apparatus of claim 6, further comprising tuning capacitors connected to said RF coils.

* * * * *